(12) United States Patent
Swier

(10) Patent No.: US 9,175,140 B2
(45) Date of Patent: Nov. 3, 2015

(54) COMPOSITIONS OF RESIN-LINEAR ORGANOSILOXANE BLOCK COPOLYMERS

(71) Applicant: Dow Corning Corporation, Midland, MI (US)

(72) Inventor: Steven Swier, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 14/386,213

(22) PCT Filed: Mar. 14, 2013

(86) PCT No.: PCT/US2013/031253
§ 371 (c)(1),
(2) Date: Sep. 18, 2014

(87) PCT Pub. No.: WO2013/142240
PCT Pub. Date: Sep. 26, 2013

(65) Prior Publication Data
US 2015/0112011 A1    Apr. 23, 2015

Related U.S. Application Data

(60) Provisional application No. 61/613,516, filed on Mar. 21, 2012, provisional application No. 61/768,711, filed on Feb. 25, 2013.

(51) Int. Cl.
| | | |
|---|---|---|
| C08G 77/44 | (2006.01) |
| C09D 183/14 | (2006.01) |
| C08L 83/10 | (2006.01) |
| C08K 3/22 | (2006.01) |
| C09D 183/10 | (2006.01) |
| H01L 33/56 | (2010.01) |
| C08G 77/00 | (2006.01) |

(52) U.S. Cl.
CPC . *C08G 77/44* (2013.01); *C08K 3/22* (2013.01); *C08L 83/10* (2013.01); *C09D 183/10* (2013.01); *C09D 183/14* (2013.01); *H01L 33/56* (2013.01); *C08G 77/80* (2013.01); *C08G 2190/00* (2013.01); *C08K 2003/2227* (2013.01)

(58) Field of Classification Search
None
See application file for complete search history.

(56) References Cited

U.S. PATENT DOCUMENTS

| | | | |
|---|---|---|---|
| 3,294,718 A * | 12/1966 | Antonen | 528/19 |
| 3,328,481 A * | 6/1967 | Vincent | 525/477 |
| 3,576,905 A * | 4/1971 | McKellar et al. | 528/34 |
| 3,607,972 A * | 9/1971 | Kiles et al. | 525/477 |
| 3,619,229 A * | 11/1971 | Hartlein | 523/209 |
| 3,629,228 A * | 12/1971 | Hartlein et al. | 528/17 |
| 3,639,155 A * | 2/1972 | Hartlein et al. | 428/447 |
| 3,647,846 A * | 3/1972 | Hartlein et al. | 556/436 |
| 3,670,649 A * | 6/1972 | Hartlein et al. | 102/431 |
| 4,419,402 A * | 12/1983 | Gutek | 442/145 |
| 4,443,502 A * | 4/1984 | Gutek | 427/387 |
| 6,803,409 B2 * | 10/2004 | Keryk et al. | 524/837 |
| 2002/0055601 A1* | 5/2002 | Kizaki et al. | 528/12 |
| 2005/0180712 A1* | 8/2005 | Shelnut et al. | 385/129 |
| 2009/0050852 A1 | 2/2009 | Kanamori et al. | |

FOREIGN PATENT DOCUMENTS

| | | |
|---|---|---|
| JP | 2006348284 A | 12/2006 |
| JP | 2007277072 A | 10/2007 |
| JP | 2007277505 A | 10/2007 |
| WO | WO-2013/142240 A1 | 9/2013 |

OTHER PUBLICATIONS

"International Application Serial No. PCT/US2013/031253, International Search Report mailed Jul. 16, 2013", 3 pgs.
"International Application Serial No. PCT/US2013/031253, Written Opinion mailed Jul. 16, 2013", 6 pgs.
"International Application Serial No. PCT/US2013/031253, International Preliminary Report on Patentability mailed Oct. 2, 2014", 8 pgs.

\* cited by examiner

*Primary Examiner* — Robert S Loewe
(74) *Attorney, Agent, or Firm* — Schwegman Lundberg & Woessner, P.A.

(57) ABSTRACT

Curable compositions of "resin-linear" organosiloxane block copolymers comprising a metal ligand complex are disclosed. The addition of a metal ligand complex to compositions of certain resin-linear organosiloxane block copolymers results in curable compositions having faster cure rates, and improved mechanical strength and/or thermal stability over similar compositions without the metal ligand complex.

23 Claims, No Drawings

COMPOSITIONS OF RESIN-LINEAR ORGANOSILOXANE BLOCK COPOLYMERS

CROSS-REFERENCE TO RELATED APPLICATIONS

This application is a U.S. national stage application filed under 35 U.S.C. §371 from International Application Serial No. PCT/US2013/031253, which was filed Mar. 14, 2013, and published as WO 2013/142240 on Sep. 26, 2013, and which claims the benefit of U.S. Provisional Patent Appl. Ser. Nos. 61/613,516, filed Mar. 21, 2012 and 61/768,711, filed Feb. 25, 2013, which applications and publication are incorporated by reference as if reproduced herein and made a part hereof in their entirety, and the benefit of priority of each of which is claimed herein.

BACKGROUND

Light emitting diodes (LEDs) and solar panels use an encapsulant coating to protect electronic components from environmental factors. Such protective coatings must be optically clear to ensure maximum efficiency of these devices. Furthermore, these protective coatings must be tough, durable, long lasting, and yet easy to apply. Many of the currently available coatings, however, lack toughness; are not durable; are not long-lasting; and/or are not easy to apply. There is therefore a continuing need to identify protective and/or functional coatings in many areas of emerging technologies.

BRIEF SUMMARY OF THE EMBODIMENTS

Embodiment 1 relates to a curable composition comprising:
  i) an organosiloxane block copolymer comprising:
    40 to 90 mole percent disiloxy units of the formula $[R^1{}_2SiO_{2/2}]$,
    10 to 60 mole percent trisiloxy units of the formula $[R^2SiO_{3/2}]$,
    0.5 to 35 mole percent silanol groups [≡SiOH];
  wherein:
    each $R^1$, at each occurrence, is independently a $C_1$ to $C_{30}$ hydrocarbyl,
    each $R^2$, at each occurrence, is independently a $C_1$ to $C_{20}$ hydrocarbyl;
  wherein:
    the disiloxy units $[R^1{}_2SiO_{2/2}]$ are arranged in linear blocks having an average of from 10 to 400 disiloxy units $[R^1{}_2SiO_{2/2}]$ per linear block, the trisiloxy units $[R^2SiO_{3/2}]$ are arranged in non-linear blocks having a molecular weight of at least 500 g/mole, and at least 30% of the non-linear blocks are crosslinked with each other, each linear block is linked to at least one non-linear block; and
    the organosiloxane block copolymer has a weight average molecular weight ($M_w$) of at least 20,000 g/mole; and
  ii) a metal ligand complex.

Embodiment 2 relates to the curable composition of Embodiment 1, further comprising a solvent, a filler or a phosphor.

Embodiment 3 relates to the curable composition of Embodiment 1, wherein the metal ligand complex comprises a metal acetylacetonate complex.

Embodiment 4 relates to the curable composition of Embodiment 1, wherein the metal is Al, Bi, Sn, Ti or Zr.

Embodiment 5 relates to the curable composition of Embodiment 1, wherein the metal ligand complex comprises a tetravalent tin-containing metal ligand complex.

Embodiment 6 relates to the curable composition of Embodiment 1, wherein the metal ligand complex comprises a dialkyltin dicarboxylate.

Embodiment 7 relates to the curable composition of Embodiment 1, wherein the metal ligand complex comprises dimethyltin dineodecanoate.

Embodiment 8 relates to the curable composition of Embodiments 1-7, wherein $R^2$ is phenyl.

Embodiment 9 relates to the curable composition of Embodiments 1-8, wherein $R^1$ is methyl or phenyl.

Embodiment 10 relates to the curable composition of Embodiments 1-9, wherein the disiloxy units have the formula $[(CH_3)(C_6H_5)SiO_{2/2}]$.

Embodiment 11 relates to the curable composition of Embodiments 1-10, wherein the disiloxy units have the formula $[(CH_3)_2SiO_{2/2}]$.

Embodiment 12 relates to the curable composition of Embodiments 1-11, further comprising a stabilizer.

Embodiment 13 relates to a solid film composition comprising the curable composition of Embodiments 1-12.

Embodiment 14 relates to the solid film composition of Embodiment 13, wherein the solid composition has an optical transmittance of at least 95%.

Embodiment 15 relates to the cured product of the composition of Embodiments 1-14.

Embodiment 16 relates to an LED encapsulant comprising the compositions of Embodiments 1-15.

Embodiment 17 relates to a method of maintaining the cure onset temperature of a composition comprising a resin linear organosiloxane block copolymer and a filler and/or a phosphor, within about 40% of the cure onset temperature of a composition comprising the resin linear organosiloxane block copolymer, but lacking the filler and/or phosphor, the method comprising contacting the composition comprising a resin linear organosiloxane block copolymer and a filler and/or a phosphor with a metal ligand complex.

Embodiment 18 relates to the method of Embodiment 17, wherein the cure onset temperature is maintained within about 20% of the cure onset temperature of the composition lacking the filler and/or phosphor.

Embodiment 19 relates to the method of Embodiments 17-18, wherein the cure onset temperature of the composition lacking the filler is less than 220° C.

Embodiment 20 relates to the method of Embodiments 17-18, wherein the cure onset temperature of the composition lacking the filler is from about 120° C. to about 220° C.

Embodiment 21 relates the method of Embodiments 17-20, wherein the composition comprising the filler comprises from about 2% to about 90% filler based on the total weight of the composition.

Embodiment 22 relates the method of Embodiments 17-20, wherein the composition comprising the phosphor comprises from about 5% to about 80% phosphor based on the total weight of the composition.

Embodiment 23 relates to a method of maintaining the time necessary to reach a tan delta value equal to 1 of a composition comprising a resin linear organosiloxane block copolymer and up to a total of 80 wt. % of a filler and/or a phosphor, within about 40% of the time necessary to reach a tan delta value equal to 1 of a composition comprising the resin linear organosiloxane block copolymer, but lacking the filler and/or phosphor, the method comprising contacting the composition comprising a resin linear organosiloxane block copolymer and a filler and/or a phosphor with a metal ligand complex.

Embodiment 24 relates to the method of Embodiments 17 or 23, wherein the composition comprising a resin linear organosiloxane block copolymer is a curable composition comprising:

an organosiloxane block copolymer comprising:
40 to 90 mole percent disiloxy units of the formula [$R^1_2SiO_{2/2}$],
10 to 60 mole percent trisiloxy units of the formula [$R^2SiO_{3/2}$],
0.5 to 35 mole percent silanol groups [≡SiOH];
wherein:
each $R^1$, at each occurrence, is independently a $C_1$ to $C_{30}$ hydrocarbyl,
each $R^2$, at each occurrence, is independently a $C_1$ to $C_{20}$ hydrocarbyl;
wherein:
the disiloxy units [$R^1_2SiO_{2/2}$] are arranged in linear blocks having an average of from 10 to 400 disiloxy units [$R^1_2SiO_{2/2}$] per linear block, the trisiloxy units [$R^2SiO_{3/2}$] are arranged in non-linear blocks having a molecular weight of at least 500 g/mole, and at least 30% of the non-linear blocks are crosslinked with each other, each linear block is linked to at least one non-linear block; and
the organosiloxane block copolymer has a weight average molecular weight ($M_w$) of at least 20,000 g/mole.

DETAILED DESCRIPTION OF THE EMBODIMENTS

The present disclosure provides curable and solid compositions comprising "resin linear" organosiloxane block copolymers, where the compositions comprise a metal ligand complex and, in some embodiments, other components, including fillers and/or phosphors. In some instances, it is advantageous to include such other components in the coating to provide, among other things, certain functionality or alter the physical properties of a coating comprising the "resin linear" organsiloxane block copolymers described herein. For example, various fillers may be added to curable compositions to improved the heat dissipation properties of a coating. In other instances, it is desirable to prepare curable compositions containing phosphors for forming films or coatings that can be used in LED articles. But, in some cases, the incorporation of additional ingredients, such as fillers, may diminish cure performance (e.g., speed and extent of cure). It has been found that the incorporation of certain catalysts helps to counteract any detrimental effects that additional ingredients may have on cure performance. In some embodiments, the catalyst helps to counteract any detrimental effects on cure performance by interacting or absorbing onto these additional ingredients.

The compositions of the embodiments described herein comprise:

i) an organosiloxane block copolymer comprising:
40 to 90 mole percent disiloxy units of the formula [$R^1_2SiO_{2/2}$],
10 to 60 mole percent trisiloxy units of the formula [$R^2SiO_{3/2}$],
0.5 to 35 mole percent silanol groups [≡SiOH];
wherein:
each $R^1$, at each occurrence, is independently a $C_1$ to $C_{30}$ hydrocarbyl,
each $R^2$, at each occurrence, is independently a $C_1$ to $C_{20}$ hydrocarbyl,
wherein:
the disiloxy units [$R^1_2SiO_{2/2}$] are arranged in linear blocks having an average of from 10 to 400 disiloxy units [$R^1_2SiO_{2/2}$] per linear block, the trisiloxy units [$R^2SiO_{3/2}$] are arranged in non-linear blocks having a molecular weight of at least 500 g/mole, and at least 30% of the non-linear blocks are crosslinked with each other, each linear block is linked to at least one non-linear block, and
the organosiloxane block copolymer has an average molecular weight ($M_w$) of at least 20,000 g/mole; and
ii) a metal ligand complex.

i) Organosiloxane Block Copolymer

The organosiloxane block copolymers comprise:
40 to 90 mole percent disiloxy units of the formula [$R^1_2SiO_{2/2}$],
10 to 60 mole percent trisiloxy units of the formula [$R^2SiO_{3/2}$],
0.5 to 35 mole percent silanol groups [≡SiOH];
wherein:
each $R^1$, at each occurrence, is independently a $C_1$ to $C_{30}$ hydrocarbyl,
each $R^2$, at each occurrence, is independently a $C_1$ to $C_{20}$ hydrocarbyl;
wherein:
the disiloxy units [$R^1_2SiO_{2/2}$] are arranged in linear blocks having an average of from 10 to 400 disiloxy units [$R^1_2SiO_{2/2}$] per linear block, the trisiloxy units [$R^2SiO_{3/2}$] are arranged in non-linear blocks having a molecular weight of at least 500 g/mole, and at least 30% of the non-linear blocks are crosslinked with each other, each linear block is linked to at least one non-linear block; and
the organosiloxane block copolymer has a molecular weight of at least 20,000 g/mole.

The organopolysiloxanes of the embodiments described herein as "resin-linear" organosiloxane block copolymers. Methods of preparing such resin-linear organosiloxane block copolymers and compositions comprising such block copolymers are known in the art. See, e.g., Published PCT Application Nos. WO2012/040305 and WO2012/040367, the entireties of both of which are incorporated by reference as if fully set forth herein. Organopolysiloxanes are polymers containing siloxy units independently selected from [$R_3SiO_{1/2}$], [$R_2SiO_{2/2}$], [$RSiO_{3/2}$], or [$SiO_{4/2}$] siloxy units, where R may be, e.g., any organic group. These siloxy units are commonly referred to as M, D, T, and Q units respectively. These siloxy units can be combined in various manners to form cyclic, linear, or branched structures. The chemical and physical properties of the resulting polymeric structures vary depending on the number and type of siloxy units in the organopolysiloxane. For example, "linear" organopolysiloxanes contain, in some embodiments, mostly D, or [$R_2SiO_{2/2}$] siloxy units, which results in polydiorganosiloxanes that are fluids of varying viscosities, depending on the "degree of polymerization" or "dp" as indicated by the number of D units in the polydiorganosiloxane. "Linear" organopolysiloxanes, in some embodiments, have glass transition temperatures ($T_g$) that are lower than 25° C. "Resin" organopolysiloxanes result when a majority of the siloxy units are selected from T or Q siloxy units. When T siloxy units are predominately used to prepare an organopolysiloxane, the resulting organosiloxane is often referred to as a "resin" or a "silsesquioxane resin." Increasing the amount of T or Q siloxy units in an organopolysiloxane, in some embodiments, results in polymers having increasing hardness and/or glass like properties. "Resin" organopolysiloxanes thus have higher $T_g$ values, for example siloxane resins often have $T_g$ values greater than 40° C., e.g., greater than 50° C., greater than 60° C., greater than 70° C., greater than 80° C., greater than 90° C. or greater than 100° C. In some embodiments, $T_g$ for siloxane resins is from about 60° C. to about 100° C., e.g., from about 60° C. to about 80° C., from about 50° C. to about 100° C., from about 50° C. to about 80° C. or from about 70° C. to about 100° C.

As used herein "organosiloxane block copolymers" or "resin-linear organosiloxane block copolymers" refer to organopolysiloxanes containing "linear" D siloxy units in combination with "resin" T siloxy units. In some embodiments, the organosiloxane copolymers are "block" copolymers, as opposed to "random" copolymers. As such, the "resin-linear organosiloxane block copolymers" of the disclosed embodiments refer to organopolysiloxanes containing D and T siloxy units, where the D units (i.e., $[R^1_2SiO_{2/2}]$ units) are primarily bonded together to form polymeric chains having, in some embodiments, an average of from 10 to 400 D units (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), which are referred herein as "linear blocks."

The T units (i.e., $[R^2SiO_{3/2}]$) are, in some embodiments, primarily bonded to each other to form branched polymeric chains, which are referred to as "non-linear blocks." In some embodiments, a significant number of these non-linear blocks may further aggregate to form "nano-domains" when solid forms of the block copolymer are provided. In some embodiments, these nano-domains form a phase separate from a phase formed from linear blocks having D units, such that a resin-rich phase forms. In some embodiments, the disiloxy units $[R^1_2SiO_{2/2}]$ are arranged in linear blocks having an average of from 10 to 400 disiloxy units $[R^1_2SiO_{2/2}]$ per linear block (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), and the trisiloxy units $[R^2SiO_{3/2}]$ are arranged in non-linear blocks having a molecular weight of at least 500 g/mole and at least 30% of the non-linear blocks are crosslinked with each other.

In some embodiments, the non-linear blocks have a number average molecular weight of at least 500 g/mole, e.g., at least 1000 g/mole, at least 2000 g/mole, at least 3000 g/mole or at least 4000 g/mole; or have a molecular weight of from about 500 g/mole to about 4000 g/mole, from about 500 g/mole to about 3000 g/mole, from about 500 g/mole to about 2000 g/mole, from about 500 g/mole to about 1000 g/mole, from about 1000 g/mole to 2000 g/mole, from about 1000 g/mole to about 1500 g/mole, from about 1000 g/mole to about 1200 g/mole, from about 1000 g/mole to 3000 g/mole, from about 1000 g/mole to about 2500 g/mole, from about 1000 g/mole to about 4000 g/mole, from about 2000 g/mole to about 3000 g/mole or from about 2000 g/mole to about 4000 g/mole.

In some embodiments, at least 30% of the non-linear blocks are crosslinked with each other, e.g., at least 40% of the non-linear blocks are crosslinked with each other; at least 50% of the non-linear blocks are crosslinked with each other; at least 60% of the non-linear blocks are crosslinked with each other; at least 70% of the non-linear blocks are crosslinked with each other; or at least 80% of the non-linear blocks are crosslinked with each other, wherein all of the percentages given herein to indicate percent non-linear blocks that are crosslinked are in weight percent. In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 55% to about 70% of the non-linear blocks are crosslinked with each other, from about 50% to about 60% of the non-linear blocks are crosslinked with each other; from about 60% to about 80% of the non-linear blocks are crosslinked with each other; or from about 60% to about 70% of the non-linear blocks are crosslinked with each other.

The organosiloxane block copolymers (e.g., those comprising 40 to 90 mole percent disiloxy units of the formula $[R^1_2SiO_{2/2}]$ and 10 to 60 mole percent trisiloxy units of the formula $[R^2SiO_{3/2}]$) may be represented by the formula $[R^1_2SiO_{2/2}]_a[R^2SiO_{3/2}]_b$ where the subscripts a and b represent the mole fractions of the siloxy units in the copolymer, a is about 0.4 to about 0.9,
   alternatively about 0.5 to about 0.9,
   alternatively about 0.6 to about 0.9,
b is about 0.1 to 0.6 about,
   alternatively about 0.1 to about 0.5,
   alternatively about 0.1 to about 0.4,
wherein each $R^1$, at each occurrence, is independently a $C_1$ to $C_{30}$ hydrocarbyl, and
each $R^2$, at each occurrence, is independently a $C_1$ to $C_{10}$ hydrocarbyl.

In some embodiments, the organosiloxane block copolymers of the embodiments described herein comprise 40 to 90 mole percent disiloxy units of the formula $[R^1_2SiO_{2/2}]$, e.g., 50 to 90 mole percent disiloxy units of the formula $[R^1_2SiO_{2/2}]$; 60 to 90 mole percent disiloxy units of the formula $[R^1_2SiO_{2/2}]$; 65 to 90 mole percent disiloxy units of the formula $[R^1_2SiO_{2/2}]$; 70 to 90 mole percent disiloxy units of the formula $[R^1_2SiO_{2/2}]$; or 80 to 90 mole percent disiloxy units of the formula $[R^1_2SiO_{2/2}]$; 40 to 80 mole percent disiloxy units of the formula $[R^1_2SiO_{2/2}]$; 40 to 70 mole percent disiloxy units of the formula $[R^1_2SiO_{2/2}]$; 40 to 60 mole percent disiloxy units of the formula $[R^1_2SiO_{2/2}]$; 40 to 50 mole percent disiloxy units of the formula $[R^1_2SiO_{2/2}]$; 50 to 80 mole percent disiloxy units of the formula $[R^1_2SiO_{2/2}]$; 50 to 70 mole percent disiloxy units of the formula $[R^1_2SiO_{2/2}]$; 50 to 60 mole percent disiloxy units of the formula $[R^1_2SiO_{2/2}]$; 60 to 80 mole percent disiloxy units of the formula $[R^1_2SiO_{2/2}]$; 60 to 70 mole percent disiloxy units of the formula $[R^1_2SiO_{2/2}]$; or 70 to 80 mole percent disiloxy units of the formula $[R^1_2SiO_{2/2}]$.

In some embodiments, the organosiloxane block copolymers of the embodiments described herein comprise 10 to 60 mole percent trisiloxy units of the formula $[R^2SiO_{3/2}]$, e.g., 10 to 20 mole percent trisiloxy units of the formula $[R^2SiO_{3/2}]$; 10 to 30 mole percent trisiloxy units of the formula $[R^2SiO_{3/2}]$; 10 to 35 mole percent trisiloxy units of the formula $[R^2SiO_{3/2}]$; 10 to 40 mole percent trisiloxy units of the formula $[R^2SiO_{3/2}]$; 10 to 50 mole percent trisiloxy units of the formula $[R^2SiO_{3/2}]$; 20 to 30 mole percent trisiloxy units of the formula $[R^2SiO_{3/2}]$; 20 to 35 mole percent trisiloxy units of the formula $[R^2SiO_{3/2}]$; 20 to 40 mole percent trisiloxy units of the formula $[R^2SiO_{3/2}]$; 20 to 50 mole percent trisiloxy units of the formula $[R^2SiO_{3/2}]$; 20 to 60 mole percent trisiloxy units of the formula $[R^2SiO_{3/2}]$; 30 to 40 mole percent trisiloxy units of the formula $[R^2SiO_{3/2}]$; 30 to 50 mole percent trisiloxy units of the formula $[R^2SiO_{3/2}]$; 30 to 60 mole percent trisiloxy units of the formula $[R^2SiO_{3/2}]$; 40 to 50 mole percent trisiloxy units of the formula $[R^2SiO_{3/2}]$; or 40 to 60 mole percent trisiloxy units of the formula $[R^2SiO_{3/2}]$.

It should be understood that the organosiloxane block copolymers of the embodiments described herein may contain additional siloxy units, such as M siloxy units, Q siloxy units, other unique D or T siloxy units (for example, having organic groups other than $R^1$ or $R^2$), provided that the organosiloxane block copolymer contains the mole fractions of the disiloxy and trisiloxy units as described herein. In other words, the sum of the mole fractions as designated by subscripts a and b, do not necessarily have to sum to one. The sum of a+b may be less than one to account for minor amounts of other siloxy units that may be present in the organosiloxane block copolymer. Alternatively, the sum of a+b is greater than 0.6, alternatively greater than 0.7, alternatively greater than 0.8, or alternatively greater than 0.9. In some embodiments, the sum of a+b is from about 0.6 to about 0.9, e.g., from about 0.6 to about 0.8, from about 0.6 to about 0.7, from about 0.7 to about 0.9, from about 0.7 to about 0.8, or from about 0.8 to about 0.9.

In one embodiment, the organosiloxane block copolymer consists essentially of the disiloxy units of the formula $[R^1{}_2SiO_{2/2}]$ and trisiloxy units of the formula $[R^2SiO_{3/2}]$, while also containing 0.5 to 25 mole percent silanol groups [≡SiOH] (e.g., 0.5 to 5 mole percent, 0.5 to 10 mole percent, 0.5 to 15 mole percent, 0.5 to 20 mole percent, 5 to 10 mole percent, 5 to 15 mole percent, 5 to 20 mole percent, 5 to 25 mole percent, 10 to 15 mole percent 10 to 20 mole percent, 10 to 25 mole percent, 15 to 20 mole percent, 15 to 25 mole percent, or 20 to 25 mole percent), where $R^1$ and $R^2$ are as defined above. Thus, some embodiments, the sum of a+b (when using mole fractions to represent the amount of disiloxy and trisiloxy units in the copolymer) is greater than 0.95, alternatively greater than 0.98.

In some embodiments, the resin-linear organosiloxane block copolymers also contain silanol groups (≡SiOH). The amount of silanol groups present on the organosiloxane block copolymer may vary from 0.5 to 35 mole percent silanol groups [≡SiOH], alternatively from 2 to 32 mole percent silanol groups [≡SiOH], alternatively from 8 to 22 mole percent silanol groups [≡SiOH].

The silanol groups may be present on any siloxy units within the organosiloxane block copolymer. The amount described herein represent the total amount of silanol groups found in the organosiloxane block copolymer. In some embodiments, the majority (e.g., greater than 75%, greater than 80%, greater than 90%; from about 75% to about 90%, from about 80% to about 90%, or from about 75% to about 85%) of the silanol groups will reside on the trisiloxy units, i.e., the resin component of the block copolymer. Although not wishing to be bound by any theory, the silanol groups present on the resin component of the organosiloxane block copolymer allows for the block copolymer to further react or cure at elevated temperatures.

At each occurrence, each $R^1$ in the above disiloxy unit is independently a $C_1$ to $C_{30}$ hydrocarbyl, where the hydrocarbyl group may independently be an alkyl, aryl, or alkylaryl group. Each $R^1$, at each occurrence, may independently be a $C_1$ to $C_{30}$ alkyl group, alternatively, at each occurrence, each $R^1$ may be a $C_1$ to $C_{18}$ alkyl group. Alternatively each $R^1$, at each occurrence, may be a $C_1$ to $C_6$ alkyl group such as methyl, ethyl, propyl, butyl, pentyl, or hexyl. Alternatively each $R^1$, at each occurrence, may be methyl. Each $R^1$, at each occurrence, may be an aryl group, such as phenyl, naphthyl, or an anthryl group. Alternatively, each $R^1$, at each occurrence, may be any combination of the aforementioned alkyl or aryl groups such that, in some embodiments, each disiloxy unit may have two alkyl groups (e.g., two methyl groups); two aryl groups (e.g., two phenyl groups); or an alkyl (e.g., methyl) and an aryl group (e.g., phenyl). Alternatively, each $R^1$, at each occurrence, is phenyl or methyl.

Each $R^2$, at each occurrence, in the above trisiloxy unit is independently a $C_1$ to $C_{20}$ hydrocarbyl, where the hydrocarbyl group may independently be an alkyl, aryl, or alkylaryl group. Each $R^2$, at each occurrence, may be a $C_1$ to $C_{20}$ alkyl group, alternatively each $R^2$, at each occurrence, may be a $C_1$ to $C_{18}$ alkyl group. Alternatively each $R^2$, at each occurrence, may be a $C_1$ to $C_6$ alkyl group such as methyl, ethyl, propyl, butyl, pentyl, or hexyl. Alternatively each $R^2$, at each occurrence, may be methyl. Each $R^2$, at each occurrence, may be an aryl group, such as phenyl, naphthyl, or an anthryl group. Alternatively, each $R^2$, at each occurrence, may be any combination of the aforementioned alkyl or aryl groups such that, in some embodiments, each disiloxy unit may have two alkyl groups (e.g., two methyl groups); two aryl groups (e.g., two phenyl groups); or an alkyl (e.g., methyl) and an aryl group (e.g., phenyl). Alternatively, each $R^2$, at each occurrence, is phenyl or methyl.

As used throughout the specification, hydrocarbyl also includes substituted hydrocarbyls. "Substituted" as used throughout the specification refers broadly to replacement of one or more of the hydrogen atoms of the group with substituents known to those skilled in the art and resulting in a stable compound as described herein. Examples of suitable substituents include, but are not limited to, alkyl, alkenyl, alkynyl, cycloalkyl, aryl, alkaryl, hydroxy, alkoxy, aryloxy, carboxy (i.e., $CO_2H$), carboxyalkyl, carboxyaryl, cyano, nitro and the like. Substituted hydrocabyl also includes halogen substituted hydrocarbyls, where the halogen may be fluorine, chlorine, bromine or combinations thereof.

In some embodiments, fluorinated organosiloxane block copolymers are also contemplated herein. Such fluorinated orangsiloxane block copolymers are described in U.S. Provisional Patent Appl. Ser. No. 61/608,732, filed Mar. 9, 2012; and PCT Appl. No. PCT/US2013/027904, filed Feb. 27, 2013, the entire disclosures of both of which are incorporated by reference as if fully set forth herein.

The formula $[R^1{}_2SiO_{2/2}]_a[R^2SiO_{3/2}]_b$, and related formulae using mole fractions, as used herein to describe the organosiloxane block copolymers, does not indicate structural ordering of the disiloxy $[R^1{}_2SiO_{2/2}]$ and trisiloxy $[R^2SiO_{3/2}]$ units in the copolymer. Rather, this formula is meant to provide a convenient notation to describe the relative amounts of the two units in the copolymer, as per the mole fractions described herein via the subscripts a and b. The mole fractions of the various siloxy units in the present organosiloxane block copolymers, as well as the silanol content, may be readily determined by $^{29}$Si NMR techniques, as detailed in the Examples.

The organosiloxane block copolymers of the embodiments described herein have a weight average molecular weight ($M_w$) of at least 20,000 g/mole, alternatively a weight average molecular weight of at least 40,000 g/mole, alternatively a weight average molecular weight of at least 50,000 g/mole, alternatively a weight average molecular weight of at least 60,000 g/mole, alternatively a weight average molecular weight of at least 70,000 g/mole, or alternatively a weight average molecular weight of at least 80,000 g/mole. In some embodiments, the organosiloxane block copolymers of the embodiments described herein have a weight average molecular weight ($M_w$) of from about 20,000 g/mole to about 250,000 g/mole or from about 100,000 g/mole to about 250,000 g/mole, alternatively a weight average molecular weight of from about 40,000 g/mole to about 100,000 g/mole, alternatively a weight average molecular weight of from about 50,000 g/mole to about 100,000 g/mole, alternatively a weight average molecular weight of from about 50,000 g/mole to about 80,000 g/mole, alternatively a weight average molecular weight of from about 50,000 g/mole to about 70,000 g/mole, alternatively a weight average molecular weight of from about 50,000 g/mole to about 60,000 g/mole. In some embodiments, the organosiloxane block copolymers of the embodiments described herein have a number average molecular weight ($M_n$) of from about 15,000 to about 50,000 g/mole; from about 15,000 to about 30,000 g/mole; from about 20,000 to about 30,000 g/mole; or from about 20,000 to about 25,000 g/mole. The average molecular weight may be readily determined using Gel Permeation Chromatography (GPC) techniques, such as those described in the Examples.

In some embodiments, the structural ordering of the disiloxy and trisiloxy units may be further described as follows: the disiloxy units [$R^1_2SiO_{2/2}$] are arranged in linear blocks having an average of from 10 to 400 disiloxy units [$R^1_2SiO_{2/2}$] per linear block, and the trisiloxy units [$R^2SiO_{3/2}$] are arranged in non-linear blocks having a molecular weight of at least 500 g/mole. Each linear block is linked to at least one non-linear block in the block copolymer. Furthermore, at least 30% of the non-linear blocks are crosslinked with each other,
  alternatively at least at 40% of the non-linear blocks are crosslinked with each other,
  alternatively at least at 50% of the non-linear blocks are crosslinked with each other.

In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 50% to about 60% of the non-linear blocks are crosslinked with each other; from about 60% to about 80% of the non-linear blocks are crosslinked with each other; or from about 60% to about 70% of the non-linear blocks are crosslinked with each other.

The crosslinking of the non-linear blocks may be accomplished via a variety of chemical mechanisms and/or moieties. For example, crosslinking of non-linear blocks within the block copolymer may result from the condensation of residual silanol groups present in the non-linear blocks of the copolymer. Crosslinking of the non-linear blocks within the block copolymer may also occur between "free resin" components and the non-linear blocks. "Free resin" components may be present in the block copolymer compositions as a result of using an excess amount of an organosiloxane resin during the preparation of the block copolymer. The free resin component may crosslink with the non-linear blocks by condensation of the residual silanol groups present on the non-blocks and on the free resin. The free resin may provide crosslinking by reacting with lower molecular weight compounds added as crosslinkers, as described herein. The free resin, when present, may be present in an amount of from about 10% to about 20% by weight of the organosiloxane block copolymers of the embodiments described herein, e.g., from about 15% to about 20% by weight organosiloxane block copolymers of the embodiments described herein.

Alternatively, certain compounds may be added during the preparation of the block copolymer to specifically crosslink the non-resin blocks. These crosslinking compounds may include an organosilane having the formula $R^5_qSiX_{4-q}$, which is added during the formation of the block copolymer (step II) as discussed herein), where $R^5$ is a $C_1$ to $C_8$ hydrocarbyl or a $C_1$ to $C_8$ halogen-substituted hydrocarbyl; X is a hydrolyzable group; and q is 0, 1, or 2. $R^5$ is a $C_1$ to $C_8$ hydrocarbyl or a $C_1$ to $C_8$ halogen-substituted hydrocarbyl, or alternatively $R^5$ is a $C_1$ to $C_8$ alkyl group, or alternatively a phenyl group, or alternatively $R^5$ is methyl, ethyl, or a combination of methyl and ethyl. X is any hydrolyzable group, alternatively X may be an oximo, acetoxy, halogen atom, hydroxyl (OH), or an alkoxy group.

In one embodiment, the organosilane having the formula $R^5_qSiX_{4-q}$ is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.).

Other suitable, non-limiting organosilanes useful as crosslinkers include; methyl tris(methylethylketoxime)silane (MTO), methyl triacetoxysilane, ethyl triacetoxysilane, tetraacetoxysilane, tetraoximesilane, dimethyl diacetoxysilane, dimethyl dioximesilane, and methyl tris(methylmethylketoxime) silane.

In some embodiments, the crosslinks within the block copolymer will primarily be siloxane bonds, $\equiv$Si—O—Si$\equiv$, resulting from the condensation of silanol groups, as discussed herein.

The amount of crosslinking in the block copolymer may be estimated by determining the average molecular weight of the block copolymer, such as with GPC techniques. In some embodiments, crosslinking the block copolymer increases its average molecular weight. Thus, an estimation of the extent of crosslinking may be made, given the average molecular weight of the block copolymer, the selection of the linear siloxy component (that is the chain length as indicated by its degree of polymerization), and the molecular weight of the non-linear block (which is primarily controlled by the selection of the selection of the organosiloxane resin used to prepare the block copolymer).

The present disclosure further provides curable compositions comprising:

a) the organosiloxane block copolymers as described herein, in some embodiments in combination with a stabilizer or a superbase (as described herein), and b) an organic solvent.

See, e.g., PCT Appl. No. PCT/US2012/067334, filed Nov. 30, 2012; U.S. Provisional Appl. No. 61/566,031, filed Dec. 2, 2011; PCT Appl. No. PCT/US2012/069701, filed Dec. 14, 2012; and U.S. Provisional Appl. No. 61/570,477, filed Dec. 14, 2012, the entireties of all of which are incorporated by reference as if fully set forth herein.

In some embodiments, the organic solvent is an aromatic solvent, such as benzene, toluene, or xylene.

In one embodiment, the curable compositions may further contain an organosiloxane resin (e.g., free resin that is not part of the block copolymer). The organosiloxane resin present in these compositions is, in some embodiments, the same organosiloxane resin used to prepare the organosiloxane block copolymer. Thus, the organosiloxane resin may comprise at least 60 mole % of $[R^2SiO_{3/2}]$ siloxy units in its formula (e.g., at least 70 mole % of $[R^2SiO_{3/2}]$ siloxy units or at least 80 mole % of $[R^2SiO_{3/2}]$ siloxy units; or 60-70 mole % $[R^2SiO_{3/2}]$ siloxy units, 60-80 mole % $[R^2SiO_{3/2}]$ siloxy units or 70-80 mole % $[R^2SiO_{3/2}]$ siloxy units), wherein each $R^2$, at each occurrence, is independently a $C_1$ to $C_{20}$ hydrocarbyl. Alternatively, the organosiloxane resin is a silsesquioxane resin, or alternatively a phenyl silsesquioxane resin.

The amount of the organosiloxane block copolymers, organic solvent, and optional organosiloxane resin in the present curable composition may vary. A curable composition of the present disclosure may contain:

40 to 80 weight % of the organosiloxane block copolymer as described herein (e.g., 40 to 70 weight %, 40 to 60 weight %, 40 to 50 weight %); 10 to 80 weight % of the organic solvent (e.g., 10 to 70 weight %, 10 to 60 weight %, 10 to 50 weight %, 10 to 40 weight %, 10 to 30 weight %, 10 to 20 weight %, 20 to 80 weight %, 30 to 80 weight %, 40 to 80 weight %, 50 to 80 weight %, 60 to 80 weight %, or 70 to 80 weight); and 5 to 40 weight % of the organosiloxane resin (e.g., 5 to 30 weight %, 5 to 20 weight %, 5 to 10 weight %, 10 to 40 weight %, 10 to 30 weight %, 10 to 20 weight %, 20 to 40 weight % or 30 to 40 weight %);

such that the sum of the weight % of these components does not exceed 100%. In one embodiment, the curable compositions consist essentially of the organosiloxane block copolymer as described herein, the organic solvent, and the organosiloxane resin. In some embodiments, the weight % of these components sum to 100%, or nearly 100%.

In yet another embodiment, the curable compositions contain a cure catalyst. The cure catalyst may be selected from any catalyst known in the art to effect condensation cure of organosiloxanes, such as various tin or titanium catalysts. Condensation catalyst can be any condensation catalyst that may be used to promote condensation of silicon bonded hydroxy (=silanol) groups to form Si—O—Si linkages. Examples include, but are not limited to, amines and complexes of lead, tin, titanium, zinc, and iron. Other examples include, but are not limited to basic compounds, such as trimethylbenzylammonium hydroxide, tetramethylammonium hydroxide, n-hexylamine, tributylamine, diazabicycloundecene (DBU) and dicyandiamide; and metal-containing compounds such as tetraisopropyl titanate, tetrabutyl titanate, titanium acetylacetonate, aluminum triisobutoxide, aluminum triisopropoxide, zirconium tetra(acetylacetonato), zirconium tetrabutylate, cobalt octylate, cobalt acetylacetonato, iron acetylacetonato, tin acetylacetonato, dibutyltin octylate, dibutyltin laurate, zinc octylate, zinc bezoate, zinc p-tert-butylbenzoate, zinc laurate, zinc stearate, aluminium phosphate, and aluminium triisopropoxide; organic titanium chelates such as aluminium trisacetylacetonate, aluminium bisethylacetoacetate monoacetylacetonate, diisopropoxybis (ethylacetoacetate)titanium, and diisopropoxybis(ethylacetoacetate)titanium. In some embodiments, the condensation catalysts include zinc octylate, zinc bezoate, zinc p-tert-butylbenzoate, zinc laurate, zinc stearate, aluminium phosphate, and aluminum triisopropoxide. See, e.g., U.S. Pat. No. 8,193,269, the entire disclosure of which is incorporated by reference as if fully set forth herein. Other examples of condensation catalysts include, but are not limited to aluminum alkoxides, antimony alkoxides, barium alkoxides, boron alkoxides, calcium alkoxides, cerium alkoxides, erbium alkoxides, gallium alkoxides, silicon alkoxides, germanium alkoxides, hafnium alkoxides, indium alkoxides, iron alkoxides, lanthanum alkoxides, magnesium alkoxides, neodymium alkoxides, samarium alkoxides, strontium alkoxides, tantalum alkoxides, titanium alkoxides, tin alkoxides, vanadium alkoxide oxides, yttrium alkoxides, zinc alkoxides, zirconium alkoxides, titanium or zirconium compounds, especially titanium and zirconium alkoxides, and chelates and oligo- and polycondensates of the above alkoxides, dialkyltin diacetate, tin(II) octoate, dialkyltin diacylate, dialkyltin oxide and double metal alkoxides. Double metal alkoxides are alkoxides containing two different metals in a particular ratio. In some embodiments, the condensation catalysts include titanium tetraethylate, titanium tetrapropylate, titanium tetraisopropylate, titanium tetrabutylate, titanium tetraisooctylate, titanium isopropylate tristearoylate, titanium truisopropylate stearoylate, titanium diisopropylate distearoylate, zirconium tetrapropylate, zirconium tetraisopropylate, zirconium tetrabutylate. See, e.g., U.S. Pat. No. 7,005,460, the entire disclosure of which is incorporated by reference as if fully set forth herein. In addition, the condensation catalysts include titanates, zirconates and hafnates as described in DE 4427528 C2 and EP 0 639 622 B1, both of which are incorporated by reference as if fully set forth herein.

The organosiloxane block copolymers and curable compositions containing the organosiloxane block copolymer may be prepared by the methods as described further below.

Solid compositions containing the resin-linear organosiloxane block copolymers may be prepared by removing the solvent from the curable organosiloxane block copolymer compositions as described herein. The solvent may be removed by any known processing techniques. In one embodiment, a film of the curable compositions containing the organosiloxane block copolymers is formed, and the solvent is allowed to evaporate from the film. Subjecting the films to elevated temperatures, and/or reduced pressures, will accelerate solvent removal and subsequent formation of the solid curable composition. Alternatively, the curable compositions may be passed through an extruder to remove solvent and provide the solid composition in the form of a ribbon or pellets. Coating operations against a release film could also be used as in slot die coating, knife over roll, rod, or gravure coating. Also, roll-to-roll coating operations could be used to prepare a solid film. In coating operations, a conveyer oven or other means of heating and evacuating the solution can be used to drive off the solvent and obtain the final solid film.

Although not wishing to be bound by any theory, it is believed that the structural ordering of the disiloxy and trisiloxy units in the organosiloxane block copolymer as described herein may provide the copolymer with certain unique physical property characteristics when solid compositions of the block copolymer are formed. For example, the structural ordering of the disiloxy and trisiloxy units in the copolymer may provide solid coatings that allow for a high optical transmittance of visible light (e.g., at wavelengths above 350 nm). The structural ordering may also allow the organosiloxane block copolymer to flow and cure upon heating, yet remain stable at room temperature. They may also be processed using lamination techniques. These properties are useful to provide coatings for various electronic articles to improve weather resistance and durability, while providing low cost and easy procedures that are energy efficient.

The present disclosure further relates to solid forms of the aforementioned organosiloxane block copolymers and solid compositions derived from the curable compositions described herein comprising the organosiloxane block copolymers.

In some embodiments, the aforementioned organosiloxane block copolymers are isolated in a solid form, for example by casting films of a solution of the block copolymer in an organic solvent (e.g., benzene, toluene, xylene or combinations thereof) and allowing the solvent to evaporate. Under these conditions, the aforementioned organosiloxane block copolymers can be provided as solutions in an organic solvent containing from about 50 wt % to about 80 wt % solids, e.g., from about 60 wt % to about 80 wt %, from about 70 wt % to about 80 wt % or from about 75 wt % to about 80 wt % solids. In some embodiments, the solvent is toluene. In some embodiments, such solutions will have a viscosity of from about 1500 cSt to about 4000 cSt at 25° C., e.g., from about 1500 cSt to about 3000 cSt, from about 2000 cSt to about 4000 cSt or from about 2000 cSt to about 3000 cSt at 25° C.

Upon drying or forming a solid, the non-linear blocks of the block copolymer further aggregate together to form "nano-domains" As used herein, "predominately aggregated" means the majority of the non-linear blocks of the organosiloxane block copolymer are found in certain regions of the solid composition, described herein as "nano-domains." As used herein, "nano-domains" refers to those phase regions within the solid block copolymer compositions that are phase separated within the solid block copolymer compositions and possess at least one dimension sized from 1 to 100 nanometers. The nano-domains may vary in shape, providing at least one dimension of the nano-domain is sized from 1 to 100 nanometers. Thus, the nano-domains may be regular or irregularly shaped. The nano-domains may be spherically shaped, tubular shaped, and in some instances lamellar shaped.

In a further embodiment, the solid organosiloxane block copolymers as described herein contain a first phase and an incompatible second phase, the first phase containing predominately the disiloxy units $[R^1{}_2SiO_{2/2}]$ as defined above, the second phase containing predominately the trisiloxy units $[R^2SiO_{3/2}]$ as defined above, the non-linear blocks being sufficiently aggregated into nano-domains which are incompatible with the first phase.

When solid compositions are formed from the curable compositions of the organosiloxane block copolymer, which also contain an organosiloxane resin, as described herein, the organosiloxane resin also predominately aggregates within the nano-domains.

The structural ordering of the disiloxy and trisiloxy units in the solid block copolymers of the present disclosure, and characterization of the nano-domains, may be determined explicitly using certain analytical techniques such as Transmission Electron Microscopic (TEM) techniques, Atomic Force Microscopy (AFM), Small Angle Neutron Scattering, Small Angle X-Ray Scattering, and Scanning Electron Microscopy.

Alternatively, the structural ordering of the disiloxy and trisiloxy units in the block copolymer, and formation of nano-domains, may be implied by characterizing certain physical properties of coatings resulting from the present organosiloxane block copolymers. For example, the present organosiloxane copolymers may provide coatings that have an optical transmittance of visible light greater than 95%. One skilled in the art recognizes that such optical clarity is possible (other than refractive index matching of the two phases) only when visible light is able to pass through such a medium and not be diffracted by particles (or domains as used herein) having a size greater than 150 nanometers. As the particle size, or domains further decreases, the optical clarity may be further improved. Thus, coatings derived from the present organosiloxane copolymers may have an optical transmittance of visible light of at least 95%, e.g., at least 96%; at least 97%; at least 98%; at least 99%; or 100% transmittance of visible light. As used herein, the term "visible light" includes light with wavelengths above 350 nm.

One advantage of the present resin-linear organopolysiloxanes block copolymers is that they can be processed several times, because the processing temperature ($T_{processing}$) is less than the temperature required to finally cure ($T_{cure}$) the organosiloxane block copolymer, i.e., $T_{processing} < T_{cure}$. However the organosiloxane copolymer will cure and achieve high temperature stability when $T_{processing}$ is taken above $T_{cure}$. Thus, the present resin-linear organopolysiloxanes block copolymers offer a significant advantage of being "re-processable" in conjunction with the benefits that may be associated with silicones, such as; hydrophobicity, high temperature stability, moisture/UV resistance.

In one embodiment, the solid compositions of the organosiloxane block copolymers may be considered as "melt processable." In some embodiments, the solid compositions, such as a coating formed from a film of a solution containing the organosiloxane block copolymers, exhibit fluid behavior at elevated temperatures, that is upon "melting." The "melt processable" features of the solid compositions of the organosiloxane block copolymers may be monitored by measuring the "melt flow temperature" of the solid compositions, that is when the solid composition demonstrates liquid behavior. The melt flow temperature may specifically be determined by measuring the storage modulus (G'), loss modulus (G") and tan delta as a function of temperature storage using commercially available instruments. For example, a commercial rheometer (such as TA Instruments' ARES-RDA—with 2KSTD standard flexular pivot spring transducer, with forced convection oven) may be used to measure the storage modulus (G'), loss modulus (G") and tan delta as a function of temperature. Test specimens (e.g., 8 mm wide, 1 mm thick) may be loaded in between parallel plates and measured using small strain oscillatory rheology while ramping the temperature in a range from 25° C. to 300° C. at 2° C./min (frequency 1 Hz). The flow onset may be calculated as the inflection temperature in the G' drop (labeled FLOW), the viscosity at 120° C. is reported as a measure for melt processability and the cure onset is calculated as the onset temperature in the G' rise (labeled CURE). In some embodiments, the FLOW of the solid compositions will also correlate to the glass transition temperature of the non-linear segments (i.e., the resin component) in the organosiloxane block copolymer.

In some embodiments, the time to reach tan delta=1 from a value higher than 1 is from about 3 to about 60 minutes at 150° C., e.g., from about 3 to about 5 minutes at 150° C., from about 10 to about 15 minutes at 150° C., from about 10 to about 12 minutes at 150° C., from about 8 to about 10 minutes at 150° C. or from about 30 minutes to about 60 minutes at 150° C. In other embodiments, the tan delta=1 is from about 3 to about 60 seconds at 150° C., e.g., from about 3 to about 30 seconds at 150° C., from about 10 to about 45 seconds at 150° C., from about 5 to about 50 seconds at 150° C., from about 10 to about 30 seconds at 150° C. or from about 30 seconds to about 60 seconds at 150° C. In still other embodiments, the tan delta=1 is from about 5 to about 1200 seconds at 120° C., e.g., from about 20 to about 60 seconds at 120° C., from about 20 to about 600 seconds at 120° C., from about 60 to about 1200 seconds at 120° C., from about 5 to about 100 seconds at 120° C., from about 10 to about 60 seconds at 120° C. or from about 30 seconds to about 60 seconds at 120° C.

In a further embodiment, the solid compositions may be characterized as having a melt flow temperature ranging from 25° C. to 200° C., alternatively from 25° C. to 160° C., or alternatively from 50° C. to 160° C.

It is believed that the melt processability benefits enables the reflow of solid compositions of the organosiloxane block copolymers around device architectures at temperatures below $T_{cure}$, after an initial coating or solid is formed on the device. This feature is very beneficial to encapsulated various electronic devices.

In one embodiment, the solid compositions of the organosiloxane block copolymers may be considered as "curable." In some embodiments, the solid compositions, such as a coating formed from a film of a solution containing the organosiloxane block copolymers, may undergo further physical property changes by further curing the block copolymer. As discussed herein, the present organosiloxane block copolymers contain a certain amount of silanol groups. It is believed that the presence of these silanol groups on the block copolymer permit further reactivity, i.e., a cure mechanism. Upon curing, the physical properties of solid compositions may be further altered, as discussed in certain embodiments below.

Alternatively, the "melt processability" and/or cure of the solid compositions of the organosiloxane block copolymers may be determined by rheological measurements at various temperatures.

The solid compositions containing the organosiloxane block copolymers may have a storage modulus (G') at 25° C. ranging from 0.01 MPa to 500 MPa and a loss modulus (G") ranging from 0.001 MPa to 250 MPa, alternatively a storage modulus (G') at 25° C. ranging from 0.1 MPa to 250 MPa and a loss modulus (G") ranging from 0.01 MPa to 125 MPa, alternatively a storage modulus (G') at 25° C. ranging from 0.1 MPa to 200 MPa and a loss modulus (G") ranging from 0.01 MPa to 100 MPa.

The solid compositions containing the organosiloxane block copolymers may have a storage modulus (G') at 120° C. ranging from 10 Pa to 500,000 Pa and a loss modulus (G") ranging from 10 Pa to 500,000 Pa, alternatively a storage modulus (G') at 120° C. ranging from 20 Pa to 250,000 Pa and a loss modulus (G") ranging from 20 Pa to 250,000 Pa, alternatively a storage modulus (G') at 120° C. ranging from 30 Pa to 200,000 Pa and a loss modulus (G") ranging from 30 Pa to 200,000 Pa.

The solid compositions containing the organosiloxane block copolymers may have a storage modulus (G') at 200° C. ranging from 10 Pa to 100,000 Pa and a loss modulus (G") ranging from 5 Pa to 80,000 Pa, alternatively a storage modulus (G') at 200° C. ranging from 20 Pa to 75,000 Pa and a loss modulus (G") ranging from 10 Pa to 65,000 Pa, alternatively a storage modulus (G') at 200° C. ranging from 30 Pa to 50,000 Pa and a loss modulus (G") ranging from 15 Pa to 40,000 Pa.

In some embodiments, the solid curable compositions of the embodiments included herein may be also be characterized by determining the G'/G" cross-over temperature. This "crossover" temperature indicates the onset of condensation cure for the resin-linear copolymer. The G'/G" cross-over temperatures may vary with metal ligand complex concentration and may be related to the reduction in mobility of the resin-rich phase, where silanol groups may be present only on the resin and, around 100° C., the temperature is very close to the $T_g$ of the resin phase. This will result in significant mobility reduction. Thus, in certain embodiments, curable compositions may have a viscosity of at least 1700 Pa·s at 120° C., alternatively at least 2000 Pa·s at 120° C., alternatively at least 5000 Pa·s at 120° C., alternatively at least 10,000 Pa·s at 120° C., alternatively at least 20,000 Pa·s at 120° C. or alternatively at least 30,000 Pa·s at 120° C. In other embodiments, the curable compositions may have a viscosity of from about 1500 Pa·s at 120° C. to about 50,000 Pa·s at 120° C.; e.g., from about 1700 Pa·s at 120° C. to about 3000 Pa·s at 120° C.; about 2500 Pa·s at 120° C. to about 5000 Pa·s at 120° C.; from about 1500 Pa·s at 120° C. to about 2000 Pa·s at 120° C.; from about 1600 Pa·s at 120° C. to about 1800 Pa·s at 120° C., from about 10,000 Pa·s at 120° C. to about 40,000 Pa·s at 120° C., from about 20,000 Pa·s at 120° C. to about 40,000 Pa·s at 120° C. or from about 25,000 Pa·s at 120° C. to about 35,000 Pa·s at 120° C.

The solid compositions may be further characterized by certain physical properties such as tensile strength and % elongation at break. The present solid compositions derived from the aforementioned organosiloxane block copolymers may have an initial tensile strength greater than 1.0 MPa, alternatively greater than 1.5 MPa, or alternatively greater than 2 MPa. In some embodiments, the solid compositions may have an initial tensile strength for from 1.0 MPa to about 10 MPa, e.g., from about 1.5 MPa to about 10 MPa, from about 2 MPa to about 10 MPa, from about 5 MPa to about 10 MPa or from about 7 MPa to about 10 MPa. The present solid compositions derived from the aforementioned organosiloxane block copolymers may have an initial % elongation at break (or rupture) greater than 40%, alternatively greater than 50%, or alternatively greater than 75%. In some embodiments, the solid compositions may have a % elongation at break (or rupture) of from about 20% to about 90%, e.g., from about 25% to about 50%, from about 20% to about 60%, from about 40% to about 60%, from about 40% to about 50%, or from about 75% to about 90%. As used herein, tensile strength and % elongation at break are measured according to ASTM D412.

ii) Metal Ligand Complex

The compositions of the present disclosure (e.g., curable compositions) also contain a metal ligand complex as a catalyst. The metal ligand complex is added to enhance the cure (e.g., the cure rate) of the compositions containing the resin-linear organosiloxane copolymers, as described herein as component i). The metal ligand complex may be selected from any metal ligand complexes known for catalyzing condensation reactions, such as metal ligand complexes based on Al, Bi, Sn, Ti, and/or Zr. Alternatively, the metal ligand complex comprises an aluminum-containing metal ligand complex.

Alternatively, the metal ligand complex comprises any tetravalent tin-containing metal ligand complex capable of promoting and/or enhancing the cure of the compositions containing the resin-linear organosiloxane copolymers described herein. In some embodiments, the tetravalent tin-containing metal ligand complex is a dialkyltin dicarboxylate. In some embodiments, the tetravalent tin-containing metal ligand complex includes those comprising one or more carboxylate ligands including, but not limited to, dibutyltin dilaurate, dimethyltin dineodecanoate, dibutyltin diacetate, dimethylhydroxy(oleate)tin, dioctyldilauryltin, and the like.

The ligand associated with the metal may be selected from various organic groups, including those known for the ability to form ligand complexes with the metal selected as the condensation catalyst. In some embodiments, the ligand is selected from carboxylate ligands, β-diketonate ligands, and/or α-diketonate ligands.

In some embodiments, the carboxylate ligands that may be comprised in the compositions of the present disclosure (e.g., curable compositions) have a formula $R^{15}COO^-$ where $R^{15}$ is selected from hydrogen, alkyl groups, alkenyl groups, alkynyl, aryl, and arylalkyl groups. In some embodiments, the metal ligand complex comprises one or more carboxylate ligands, in addition to other ligands including, but not limited to, hydroxy and alkyl ligands having from 1 to about 18 carbon atoms, e.g., from about 1 to about 12 carbon atoms; from about 1 to about 9 carbon atoms; from about 1 to about 8 carbon atoms; from about 1 to about 5 carbon atoms; from about 1 to about 4; and from about 1 to about 3 carbon atoms.

Examples of useful alkyl groups for $R^{15}$ include alkyl groups having from about 1 to about 18 carbon atoms, e.g., from about 1 to about 12 carbon atoms; from about 1 to about 9 carbon atoms; from about 1 to about 8 carbon atoms; from about 1 to about 5 carbon atoms; from about 1 to about 4; and from about 1 to about 3 carbon atoms. Representative alkyl groups include, but are not limited to, methyl, ethyl, propyl, butyl, pentyl, hexyl, and octyl. The alkyl group may be branched. Branched alkyl groups include, but are not limited to, iso-propyl, iso-amyl, t-butyl, sec-butyl, neopentyl, and the group $-C(CH_3)_2(CH_2)_5CH_3$ (where the carboxylate ligand would be a neodecanoate ligand of the formula $-O(O)CC(CH_3)_2(CH_2)_5CH_3$). The alkyl group may also be a cycloalkyl group or a cycloalkyl alkyl group, where an alkyl group comprises a cycloalkyl group attached thereto. Representative cycloalkyl groups include, but are not limited to, cyclopropyl, cyclobutyl, cyclopentyl, and cyclohexyl.

Examples of useful alkenyl groups for $R^{15}$ include alkenyl groups having from about 2 to about 18 carbon atoms, e.g., from about 2 to about 12 carbon atoms; from about 2 to about 8 carbon atoms; from about 2 to about 5 carbon atoms; and from about 2 to about 3 carbon; and one or more double bonds. Representative alkenyl groups include, but are not limited to, vinyl, 2-propenyl, allyl, hexenyl, and octenyl. The alkenyl group may be branched or cyclic. Representative branched alkenyl groups include any of the above-mentioned alkyl groups capable of having at least one double bond. Representative cyclic alkenyl groups include any of the above-mentioned cycloalkyl groups capable of having at least one double bond.

Examples of useful alkynyl groups for $R^{15}$ include alkynyl groups having from about 2 to about 18 carbon atoms, e.g., from about 2 to about 12 carbon atoms; from about 2 to about 8 carbon atoms; from about 2 to about 5 carbon atoms; and from about 2 to about 3 carbon; and one or more triple bonds. The alkynyl group may be branched. Representative branched alkynyl groups include any of the above-mentioned alkyl groups capable of having at least one triple bond. Representative alkynyl groups include, but are not limited to, ethynyl, propynyl, 2-butynyl, 3-methylbutynyl, and the like.

Examples of useful aryl groups for $R^{15}$ include, but are not limited to, monocyclic and multicyclic aromatic groups (fused and non-fused). Arylalkyl groups include, but are not limited to alkyl groups where one or more hydrogen atoms has been replaced with an aryl group. Examples of useful aryl and arylalkyl groups for $R^{15}$ include aryl and arylalkyl groups having from about 6 to about 18 carbon atoms, alternatively about 6 to about 12 carbon atoms or from about 6 to about 8 carbon atoms. Representative aryl groups include, but are not limited to phenyl, biphenyl, anthracenyl, naphthyl, pyrenyl, and the like. Representative arylalkyl groups include, but are not limited to, benzyl.

In some embodiments, $R^{15}$ is methyl, 2-propenyl, allyl, or phenyl.

In some embodiments, β-diketonate ligands can have the following structures:

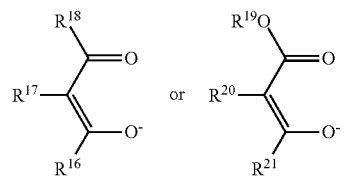

where $R^{16}$, $R^{18}$, and $R^{21}$ may be monovalent alkyl, alkenyl, aryl or arylalkyl groups, as the groups are defined above, with the understanding that all resonance structures of the two β-diketonate ligands picture above, are also included.

Examples of useful alkyl groups for $R^{16}$, $R^{18}$, and $R^{21}$ include alkyl groups (e.g., linear, branched, and cyclic, such as the linear, branched, and cyclic alkyl groups used in the description of $R^{15}$ herein) having from about 1 to about 12 carbon atoms, e.g., from about 1 to about 8 carbon atoms; from about 1 to about 5 carbon atoms; from about 1 to about 4; and from about 1 to about 3 carbon atoms. Representative alkyl groups for $R^{16}$, $R^{18}$, and $R^{21}$ include, but are not limited to, methyl, ethyl, trifluoromethyl, and t-butyl.

Examples of useful aryl groups for $R^{16}$, $R^{18}$, and $R^{21}$ include, but are not limited to, monocyclic and multicyclic aromatic groups (fused and non-fused). Arylalkyl groups for $R^{16}$, $R^{18}$, and $R^{21}$ include, but are not limited to alkyl groups where one or more hydrogen atoms have been replaced with an aryl group (e.g., monocyclic and multicyclic aromatic groups that may be fused or non-fused). Examples of useful aryl and arylalkyl groups for $R^{16}$, $R^{18}$, and $R^{21}$ include aryl and arylalkyl groups having from about 6 to about 18 carbon atoms, alternatively about 6 to about 12 carbon atoms or from about 6 to about 8 carbon atoms. Representative aryl groups include, but are not limited to phenyl, biphenyl, anthracenyl, naphthyl, pyrenyl, and the like. Representative alkylaryl groups include, but are not limited to, benzyl.

$R^{19}$ is selected from alkyl groups, alkenyl groups, aryl groups, and arylalkyl groups. Examples of useful alkyl groups for $R^{19}$ include alkyl groups (e.g., linear, branched, and cyclic, such as the linear, branched, and cyclic alkyl groups used in the description of $R^{15}$ herein) having from about 1 to about 12 carbon atoms, e.g., from about 1 to about 8 carbon atoms; from about 1 to about 5 carbon atoms; from about 1 to about 4; and from about 1 to about 3 carbon atoms. Representative alkyl groups for $R^{19}$ include, but are not limited to, methyl, ethyl, propyl, hexyl and octyl.

Examples of useful alkenyl groups for $R^{19}$ include alkenyl groups having from about 2 to about 18 carbon atoms, e.g., from about 2 to about 12 carbon atoms; from about 2 to about 8 carbon atoms; from about 2 to about 5 carbon atoms; and from about 2 to about 3 carbon; and one or more double bonds. Representative alkenyl groups include, but are not limited to, vinyl, 2-propenyl, allyl, hexenyl, and octenyl. The alkenyl group may be branched or cyclic. Representative branched alkenyl groups include any of the above-mentioned alkyl groups capable of having at least one double bond. Representative cyclic alkenyl groups include any of the above-mentioned cycloalkyl groups capable of having at least one double bond.

Examples of useful aryl groups for $R^{19}$ include, but are not limited to, monocyclic and multicyclic aromatic groups (fused and non-fused). Arylalkyl groups include, but are not limited to alkyl groups where one or more hydrogen atoms have been replaced with an aryl group (e.g., monocyclic and multicyclic aromatic groups that may be fused or non-fused). Examples of useful aryl and arylalkyl groups for $R^{19}$ include aryl and arylalkyl groups having from about 6 to about 18 carbon atoms, alternatively about 6 to about 12 carbon atoms or from about 6 to about 8 carbon atoms. Representative aryl groups include, but are not limited to phenyl, biphenyl, anthracenyl, naphthyl, pyrenyl, and the like. Representative arylalkyl groups include, but are not limited to, benzyl.

$R^{17}$ and $R^{20}$ may be selected from alkyl groups, alkenyl groups, aryl groups, and arylalkyl groups. Examples of useful alkyl groups for $R^{17}$ and $R^{20}$ include alkyl groups (e.g., linear, branched, and cyclic, such as the linear, branched, and cyclic alkyl groups used in the description of $R^{15}$ herein) having from about 1 to about 12 carbon atoms, e.g., from about 1 to about 8 carbon atoms; from about 1 to about 5 carbon atoms; from about 1 to about 4; and from about 1 to about 3 carbon atoms. Representative alkyl groups for $R^{17}$ and $R^{20}$ include, but are not limited to, methyl, ethyl, propyl, hexyl and octyl.

Examples of useful alkenyl groups for $R^{17}$ and $R^{20}$ include alkenyl groups having from about 2 to about 18 carbon atoms, e.g., from about 2 to about 12 carbon atoms; from about 2 to about 8 carbon atoms; from about 2 to about 5 carbon atoms; and from about 2 to about 3 carbon; and one or more double bonds. Representative alkenyl groups include, but are not limited to, vinyl, 2-propenyl, allyl, hexenyl, and octenyl. The alkenyl group may be branched or cyclic. Representative branched alkenyl groups include any of the above-mentioned alkyl groups capable of having at least one double bond. Representative cyclic alkenyl groups include any of the above-mentioned cycloalkyl groups capable of having at least one double bond.

Examples of useful aryl groups for $R^{17}$ and $R^{20}$ include, but are not limited to, monocyclic and multicyclic aromatic groups (fused and non-fused). Arylalkyl groups include, but are not limited to alkyl groups where one or more hydrogen atoms have been replaced with an aryl group (e.g., monocyclic and multicyclic aromatic groups that may be fused or non-fused). Examples of useful aryl and arylalkyl groups for $R^{17}$ and $R^{20}$ include aryl and arylalkyl groups having from about 6 to about 18 carbon atoms, alternatively about 6 to about 12 carbon atoms or from about 6 to about 8 carbon atoms. Representative aryl groups include, but are not limited to phenyl, biphenyl, anthracenyl, naphthyl, pyrenyl, and the like. Representative arylalkyl groups include, but are not limited to, benzyl.

In some embodiments, α-diketonate ligands can have the formula $R^{22}C(=O)CHCHC(=O)R^{23}$, wherein $R^{22}$ and $R^{23}$ may be selected from alkoxy groups (i.e., alkyl-O—), aryloxy groups (i.e., aryl-O—), and arylalkyloxy groups (i.e., arylalkyl-O—). Examples of useful alkoxy groups for $R^{22}$ and $R^{23}$ include alkoxy groups where the alkyl portion of the group may be linear, branched or cyclic (such as the linear, branched, and cyclic alkyl groups used in the description of $R^{15}$ herein) has from about 1 to about 12 carbon atoms, e.g., from about 1 to about 8 carbon atoms; from about 1 to about 5 carbon atoms; from about 1 to about 4; and from about 1 to about 3 carbon atoms. Representative alkoxy groups for $R^{22}$ and $R^{23}$ include, but are not limited to, methoxy, ethoxy, propoxy, hexyloxy and octyloxy.

Examples of useful aryloxy groups for $R^{22}$ and $R^{23}$ include, but are not limited to, monocyclic and multicyclic aryloxy groups, wherein the aryl portion of the aryloxy group may be fused or non-fused. Arylalkyloxy groups include, but are not limited to arylalkyloxy groups having an alkyl portion of the group where one or more hydrogen atoms have been replaced with an aryl group (e.g., monocyclic and multicyclic aromatic groups that may be fused or non-fused). Examples of useful aryloxy and arylalkyloxy groups for $R^{22}$ and $R^{23}$ include aryloxy and arylalkyloxy groups having from about 6 to about 18 carbon atoms, alternatively about 6 to about 12 carbon atoms or from about 6 to about 8 carbon atoms. Representative aryloxy groups include, but are not limited to phenoxy, biphenyloxy, anthracenyloxy, naphthyloxy, pyrenyloxy, and the like. Representative arylalkyloxy groups include, but are not limited to, benzyloxy.

$R^{16}$, $R^{17}$, $R^{18}$, $R^{19}$, $R^{20}$, $R^{21}$, $R^{22}$, and $R^{23}$ are each independently selected and can be the same or different. Moreover, each alkyl, alkoxy, alkenyl, aryl, aryloxy, arylalkyl and arylalkyloxy, may be substituted or unsubstituted. "Substituted," as used herein, refers broadly to replacement of one or more of the hydrogen atoms of the group with substituents known to those skilled in the art and resulting in a stable compound as described herein. Examples of suitable substituents include, but are not limited to, halo (e.g., fluorine, chlorine or bromine) alkyl, alkenyl, alkynyl, cycloalkyl, aryl, alkaryl, hydroxy, alkoxy, aryloxy, carboxy (i.e., $CO_2H$), carboxyalkyl, carboxyaryl, cyano, nitro and the like. Tolyl is an example of a substituted aryl, where the substituent is methyl ($CH_3$).

In one embodiment, the ligand is acetylacetonate, also known as an "acac" ligand.

In one embodiment, the metal ligand complex selected as the catalyst is aluminum acetylacetonate.

The amount of metal ligand complex added to the present compositions may vary, depending on the selection of the metal ligand complex and the resin-linear organosiloxane block copolymer. In some embodiments, the amount of metal ligand complex added may be the amount sufficient to catalyze a condensation reaction to, e.g., cure a composition. In other embodiments, the amounts of metal ligand complex added may be from 1 to 1000 ppm of the metal (e.g., from about 1 to about 1000 ppm; from about 1 to about 500 ppm; from about 1 to about 250 ppm; from about 1 to about 125 ppm; from about 1 to about 50 ppm; from about 50 to about 1000 ppm; from about 125 to about 1000 ppm; from about 250 to about 1000 ppm; from about 500 to about 1000 ppm; from about 50 to about 500 ppm; from about 125 to about 500 ppm; from about 250 to about 500; from about 50 to about 250 ppm; from about 125 to about 250; or from about 50 to about 125 ppm) per the amount of resin-linear organosiloxane copolymer (e.g., "solids" of the copolymer) in, e.g., curable compositions.

iii) Filler

The compositions of the present disclosure may further contain a filler, as an optional component. The filler may comprise a reinforcing filler, an extending filler, a conductive filler, or a combination thereof. For example, the composition may optionally further comprise a reinforcing filler, which, when present, may be added in an amount ranging from about 0.1% to about 95%, e.g., from about 2% to about 90%, from about 1% to about 60%; from about 25% to about 60%; from about 30% to about 60%; from about 40% to about 60%; from about 50 to about 60%; from about 25% to about 50%; from about 25% to about 40%; from about 25% to about 30%; from about 30% to about 40%; from about 30% to about 50%; or from about 40% to about 50%; based on the total weight of the composition.

The exact amount of the filler may depend on various factors including the form of the reaction product of the composition and whether any other fillers are added. In some embodiments, the amount of filler may depend on a target hardness or modulus for, e.g., a solid compositions described herein, such that higher target hardness and/or modulus may require higher filler loadings. Non-limiting examples of suitable reinforcing fillers include carbon black, zinc oxide, magnesium carbonate, aluminum silicate, sodium aluminosilicate, and magnesium silicate, as well as reinforcing silica fillers such as fume silica, silica aerogel, silica xerogel, and precipitated silica. Fumed silicas are known in the art and commercially available; e.g., fumed silica sold under the name CAB-O-SIL by Cabot Corporation of Massachusetts, U.S.A.

The composition may optionally further comprise an extending filler in an amount ranging from about 0.1% to about 95%, e.g., from about 2% to about 90%, from about 1% to about 60%; from about 1 to about 20%; from about 25% to about 60%; from about 30% to about 60%; from about 40% to about 60%; from about 50% to about 60%; from about 25% to about 50%; from about 25% to about 40%; from about 25% to about 30%; from about 30% to about 40%; from about 30% to about 50%; or from about 40% to about 50%; based on the total weight of the composition. Non-limiting examples of extending fillers include crushed quartz, aluminum oxide, magnesium oxide, calcium carbonate such as precipitated calcium carbonate, zinc oxide, talc, diatomaceous earth, iron oxide, clays, mica, chalk, titanium dioxide, zirconia, sand, carbon black, graphite, or a combination thereof. Extending fillers are known in the art and commercially available; such as a ground silica sold under the name MIN-U-SIL by U.S. Silica of Berkeley Springs, W. Va. Suitable precipitated calcium carbonates include Winnofil® SPM from Solvay and Ultrapflex® and Ultrapflex® 100 from SMI.

The composition may optionally further comprise a conductive filler in an amount ranging from about 0.1% to about 95%, e.g., from about 2% to about 90%, from about 1% to about 60%; from about 1% to about 20%; from about 25% to about 60%; from about 30% to about 60%; from about 40% to about 60%; from about 50% to about 60%; from about 25% to about 50%; from about 25% to about 40%; from about 25% to about 30%; from about 30% to about 40%; from about 30% to about 50%; or from about 40% to about 50%; based on the total weight of the composition. Conductive fillers may be thermally conductive, electrically conductive, or both. Conductive fillers are known in the art and include metal particulates (such as aluminum, copper, gold, nickel, silver, and combinations thereof); such metals coated on nonconductive substrates; metal oxides (such as aluminum oxide, beryllium oxide, magnesium oxide, zinc oxide, and combinations thereof), meltable fillers (e.g., solder), aluminum nitride, aluminum trihydrate, barium titanate, boron nitride, carbon fibers, diamond, graphite, magnesium hydroxide, onyx, silicon carbide, tungsten carbide, and a combination thereof. Alternatively, other fillers may be added to the composition, the type and amount depending on factors including the end use of the cured product of the composition. Examples of such other fillers include magnetic particles such as ferrite; and dielectric particles such as fused glass microspheres, titania, and calcium carbonate.

In one embodiment, the filler comprises alumina.

iv) Phosphor

The present compositions may include a phosphor. The phosphor is not particularly limited and may include any known in the art. In one embodiment, the phosphor is made from a host material and an activator, such as copper-activated zinc sulfide and silver-activated zinc sulfide. Suitable but non-limiting host materials include oxides, nitrides and oxynitrides, sulfides, selenides, halides or silicates of zinc, cadmium, manganese, aluminum, silicon, or various rare earth metals. Additional suitable phosphors include, but are not limited to, $Zn_2SiO_4$:Mn (Willemite); ZnS:Ag+(Zn,Cd)S:Ag; ZnS:Ag+ZnS:Cu+$Y_2O_2S$:Eu; ZnO:Zn; KCl; ZnS:Ag,Cl or ZnS:Zn; $(KF,MgF_2)$:Mn; (Zn,Cd)S:Ag or (Zn,Cd)S:Cu; $Y_2O_2S$:Eu+$Fe_2O_3$, ZnS:Cu,Al; ZnS:Ag+Co-on-$Al_2O_3$; (KF, $MgF_2$):Mn; (Zn,Cd)S:Cu,Cl; ZnS:Cu or ZnS:Cu,Ag; $MgF_2$:Mn; $(Zn,Mg)F_2$:Mn; $Zn_2SiO_4$:Mn,As; ZnS:Ag+(Zn,Cd)S:Cu; $Gd_2O_2S$:Tb; $Y_2O_2S$:Tb; $Y_3Al_5O_{12}$:Ce; $Y_2SiO_5$:Ce; $Y_3Al_5O_{12}$:Tb; ZnS:Ag,Al; ZnS:Ag; ZnS:Cu,Al or ZnS:Cu,Au,Al; (Zn,Cd)S:Cu,Cl+(Zn,Cd)S:Ag,Cl; $Y_2SiO_5$:Tb; $Y_2OS$:Tb; $Y_3(Al,Ga)_5O_{12}$:Ce; $Y_3(Al,Ga)_5O_{12}$:Tb; $InBO_3$:Tb; $InBO_3$:Eu; $InBO_3$:Tb+$InBO_3$:Eu; $InBO_3$:Tb+$InBO_3$:Eu+ZnS:Ag; $(Ba,Eu)Mg_2Al_{16}O_{27}$; $(Ce,Tb)MgAl_{11}O_{19}$; $BaMgAl_{10}O_{17}$:Eu,Mn; $BaMg_2Al_{16}O_{27}$:Eu(II); $BaMgAl_{10}O_{17}$:Eu,Mn; $BaMg_2Al_{16}O_{27}$:Eu(II),Mn(II); $Ce_{0.67}Tb_{0.33}MgAl_{11}O_{19}$:Ce,Tb; $Zn_2SiO_4$:Mn,$Sb_2O_3$; $CaSiO_3$:Pb,Mn; $CaWO_4$ (Scheelite); $CaWO_4$:Pb; $MgWO_4$; $(Sr,Eu,Ba,Ca)_5(PO_4)_3Cl$; $Sr_5Cl(PO_4)_3$:Eu(II); $(Ca,Sr,Ba)_3(PO_4)_2Cl_2$:Eu; $(Sr,Ca,Ba)_{10}(PO_4)_6Cl_2$:Eu; $Sr_2P_2O_7$:Sn(II); $Sr_6P_5BO_{20}$:Eu; $Ca_5F(PO_4)_3$:Sb; $(Ba,Ti)_2P_2O_7$:Ti; $3Sr_3(PO_4)_2.SrF_2$:Sb,Mn; $Sr_5F(PO_4)_3$:Sb,Mn; $Sr_5F(PO_4)_3$:Sb,Mn; $LaPO_4$:Ce,Tb; $(La,Ce,Tb)PO_4$; $(La,Ce,Tb)PO_4$:Ce,Tb; $Ca_3(PO_4)_2.CaF_2$:Ce,Mn; $(Ca,Zn,Mg)_3(PO_4)_2$:Sn; $(Zn,Sr)_3(PO_4)_2$:Mn; $(Sr,Mg)_3(PO_4)_2$:Sn; $(Sr,Mg)_3(PO_4)_2$:Sn(II); $Ca_5F(PO_4)_3$:Sb,Mn; $Ca_5(F,Cl)(PO_4)_3$:Sb,Mn; $(Y,Eu)_2O_3$; $Y_2O_3$:Eu(III); $Mg_4(F)GeO_6$:Mn; $Mg_4(F)(Ge,Sn)O_6$:Mn; $Y(P,V)O_4$:Eu; $YVO_4$:Eu; $Y_2O_2S$:Eu; 3.5 MgO.0.5 $MgF_2.GeO_2$:Mn; $Mg_5As_2O_{11}$:Mn; $SrAl_2O_7$:Pb; $LaMgAl_{11}O_{19}$:Ce; $LaPO_4$:Ce; $SrAl_{12}O_{19}$:Ce; $BaSi_2O_5$:Pb; $SrFB_2O_3$:Eu(II); $SrB_4O_7$:Eu; $Sr_2MgSi_2O_7$:Pb; $MgGa_2O_4$:Mn(II); $Gd_2O_2S$:Tb; $Gd_2O_2S$:Eu; $Gd_2O_2S$:Pr; $Gd_2O_2S$:Pr,Ce,F; $Y_2O_2S$:Tb; $Y_2O_2S$:Eu; $Y_2O_2S$:Pr; Zn(0.5)Cd(0.4)S:Ag; Zn(0.4)Cd(0.6)S:Ag; $CdWO_4$; $CaWO_4$; $MgWO_4$; $Y_2SiO_5$:Ce; $YAlO_3$:Ce; $Y_3Al_5O_{12}$:Ce; $Y_3(Al,Ga)_5O_{12}$:Ce; CdS:In; ZnO:Ga; ZnO:Zn; (Zn,Cd)S:Cu,Al; ZnS:Cu,Al,Au; ZnCdS:Ag,Cu; ZnS:Ag; anthracene, EJ-212, $Zn_2SiO_4$:Mn; ZnS:Cu; NaI:Tl; CsI:Tl; LiF/ZnS:Ag; LiF/ZnSCu,Al,Au, and combinations thereof.

The amount of phosphor added to the present compositions may vary and is not limiting. When present, the phosphor may be added in an amount ranging from about 0.1% to about 95%, e.g., from about 5% to about 80%, from about 1% to about 60%; from about 25% to about 60%; from about 30% to about 60%; from about 40% to about 60%; from about 50% to about 60%; from about 25% to about 50%; from about 25% to about 40%; from about 25% to about 30%; from about 30% to about 40%; from about 30% to about 50%; or from about 40% to about 50%; based on the total weight of the composition.

The present disclosure further provides a method of improving at least one of the following properties: cure (e.g., speed or extent), tensile strength, or thermal stability, of a solid curable film composition of a resin linear organopolysiloxane of the embodiments described herein by adding to the composition a metal ligand complex.

The improvements in cure properties may be characterized by the reduction in cure temperatures necessary to initiate final cure of the present compositions. In some embodiments, this may be assessed by determining the G'/G" cross-over temperature from the rheological assessment, as discussed herein. The addition of a metal ligand complex to the present resin-linear block copolymer compositions allows the cure temperature to be reduced from a temperature that, in some embodiments, ranges from 120 to 250° C. without to a temperature range of 60° C. to 150° C. In one embodiment, the temperature needed to cure the present curable composition is reduced by 10%, alternatively 20%, or alternatively 50% by the addition of a metal ligand complexes vs. comparable compositions without the metal ligand complexes. In other embodiments, the curable compositions of the embodiments described herein have a cure temperature that is about 10% to about 50% lower; e.g., from about 20% to about 50% lower; from about 10% to about 20% lower; from about 25% to about 50% lower; or from about 15 to about 30% lower than the cure temperature of comparable compositions without the metal ligand complex.

In some embodiments, the disclosure relates to a method of maintaining the cure onset temperature of curable composition described herein. In one embodiment, when the curable compositions further comprises a filler and/or a phosphor, the cure onset temperature is within about 40% (e.g., within about 30%, within about 20%, within about 15%, within about 10%, within about 5% or within less than about 5%) of the cure onset temperature of a composition lacking the filler and/or phosphor. In some embodiments, the cure onset temperature of the composition lacking the filler and/or phosphor is less than 220° C., e.g., less than about 200° C., less than about 190° C. or less than about 180° C. In some embodiments, the cure onset temperature of the composition lacking the filler and/or phosphor is from about 120° C. to about 300° C., e.g., from about 120° C. to about 250° C. or from about 120° C. to about 220° C.

By way of example, therefore, if the cure onset temperature of the composition lacking the filler and/or phosphor is 160° C. (e.g., from about 140° C. to about 160° C.), then the cure onset temperature of the composition comprising the filler and/or phosphor is, in some embodiments, no higher than about 184° C., if the cure onset temperature is "within about 15%" of the cure onset temperature of a composition lacking the filler (e.g., from about 30% to about 60% filler, based on the total weight of the composition).

The improvement in tensile strength may be characterized by at least a 50% increase, alternatively at least a 75%, or alternatively at least 100% increase in tensile strength for those compositions containing the metal ligand complex versus those not containing a metal ligand complex. In some embodiments, the improvement in tensile strength may be from about 50% to about 100% increase in tensile strength, e.g., from about 50% to about 75%, from about 60% to about 90%, about 60% to about 100% or from about 75% to about 100% increase in tensile strength.

The improvement in thermal stability may be characterized either qualitatively or quantitatively. For example, the improvements in thermal stability may be assessed qualitatively by visually assessing the change in color of the heat aged cured films (for example, color assessment after aging 100 h at 250° C.). Films prepared from the present curable compositions containing metal ligand complex may have less color than comparable compositions without the metal ligand complex. In some embodiments, the films prepared from the curable compositions containing a metal ligand complex have an optical transmittance of visible light of at least 95%, e.g., at least 96%; at least 97%; at least 98%; at least 99%; or 100% transmittance of visible light. As used herein, the term "visible light" includes light with wavelengths above 350 nm. Alternatively, thermal stability may be assessed quantitatively by techniques such as by determining the temperature ($T_d$) at which a 5 wt % loss occurs during heating at 5° C./min (see Examples for more details).

Some of the embodiments of the present invention relate to optical assemblies and articles comprising the compositions described herein such as those described in PCT/US2012/071011, filed Dec. 20, 2012; PCT/US2013/021707, filed Jan. 16, 2013; and PCT/US2013/025126, filed Feb. 7, 2013, all of which are incorporated by reference as if fully set forth herein. Accordingly, some embodiments of the present invention relate to an LED encapsulant comprising an organosiloxane block copolymer described herein.

Some embodiments of the present invention relate to methods for maintaining the time necessary to reach a tan delta value equal to 1 of a composition comprising a resin linear organosiloxane block copolymer described herein and up to a total of 90 wt. % of a filler and/or a phosphor (such that the sum of the wt. % of filler and phosphor adds up to, e.g., at most 90 wt. %), within about 40% of the time necessary to reach a tan delta value equal to 1 of a composition comprising the resin linear organosiloxane block copolymer, but lacking the filler and/or phosphor. The method comprises contacting the composition comprising a resin linear organosiloxane block copolymer herein, and a filler and/or a phosphor, with a metal ligand complex at the concentrations of metal ligand complex described herein. In some embodiments the composition comprises up to 90 wt. % of a filler and/or a phosphor, but may comprise up to 80 wt. %, up to 70 wt. %, up to 60 wt. %, up to 50 wt. %, up to 40 wt. %, up to 30 wt. %, up to 20 wt. %, up to 10 wt. %, up to 5 wt. %, from about 5 wt. % to about 90 wt. %, from about 10 wt. % to about 90 wt. %, from about 20 wt. % to about 90 wt. %, from about 30 wt. % to about 90 wt. %, from about 40 wt. % to about 90 wt. %, from about 50 wt. % to about 90 wt. %, from about 60 wt. % to about 90 wt. %, from about 10 wt. % to about 80 wt. %, from about 10 wt. % to about 70 wt. %, from about 20 wt. % to about 70 wt. %, from about 20 wt. % to about 60 wt. %, from about 30 wt. % to about 80 wt. % or from about 40 wt. % to about 70 wt. % of a filler and/or a phosphor. In other embodiments, the time necessary to reach a tan delta value equal to 1 of a composition comprising a resin linear organosiloxane block copolymer described herein is within about 30%, within about 25%, within about 20%, within about 15%, within about 10%, within about 5%, from about 5% to about 40%, from about 10% to about 40%, from about 15% to about 40%, from about 20% to about 40%, from about 25% to about 40%, from about 30% to about 40%, from about 5% to about 30%, from about 10% to about 30%, from about 15% to about 30%, or from about 20% to about 30% of the time necessary to reach a tan delta value equal to 1 of a composition comprising the resin linear organosiloxane block copolymer, but lacking the filler and/or phosphor.

The term "about," as used herein, can allow for a degree of variability in a value or range, for example, within 10%, within 5%, or within 1% of a stated value or of a stated limit of a range.

Values expressed in a range format should be interpreted in a flexible manner to include not only the numerical values explicitly recited as the limits of the range, but also to include all the individual numerical values or sub-ranges encompassed within that range as if each numerical value and sub-range were explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range.

Embodiments of the invention described and claimed herein are not to be limited in scope by the specific embodiments herein disclosed, since these embodiments are intended as illustration of several aspects of the disclosure. Any equivalent embodiments are intended to be within the scope of this disclosure. Indeed, various modifications of the embodiments in addition to those shown and described herein will become apparent to those skilled in the art from the foregoing description. Such modifications are also intended to fall within the scope of the appended claims.

The Abstract is provided to allow the reader to quickly ascertain the nature of the technical disclosure. It is submitted with the understanding that it will not be used to interpret or limit the scope or meaning of the claims.

EXAMPLES

The following examples are included to demonstrate specific embodiments of the invention. However, those of skill in the art should, in light of the present disclosure, appreciate that many changes can be made in the specific embodiments which are disclosed and still obtain a like or similar result without departing from the spirit and scope of the invention. All percentages are in wt %. All measurements were conducted at 23° C. unless indicated otherwise.

Example 1

Preparation of $(PhMeSiO_{2/2})_{0.52}$ $(PhSiO_{3/2})_{0.42}$ (45 wt % Phenyl-T)

A 500 mL 4-neck round bottom flask was loaded with Dow Corning 217 Flake (45.0 g, 0.329 moles Si) and toluene (Fisher Scientific, 70.38 g). The flask was equipped with a thermometer, Teflon stir paddle, and a Dean Stark apparatus attached to a water-cooled condenser. A nitrogen blanket was applied; the Dean Stark apparatus was prefilled with toluene; and an oil bath was used for heating. The reaction mixture was heated at reflux for 30 minutes. After cooling the reaction mixture to 108° C., a solution of diacetoxy terminated PhMe siloxane was added quickly.

The diacetoxy terminated PhMe siloxane was prepared by adding a 50/50 wt % MTA/ETA (methyltriacetoxysilane/ethyltriacetoxysilane) (1.21 g, 0.00523 moles Si) mixture to a solution of 140 dp silanol terminated PhMe siloxane (55.0 g, 0.404 moles Si) dissolved in toluene (29.62 g). The solution was mixed for 2 hours at room temperature under a nitrogen atmosphere.

After the diacetoxy terminated PhMe siloxane was added, the reaction mixture was heated at reflux for 2 hours. At this stage 50/50 wt % MTA/ETA (7.99 g, 0.0346 moles Si) was added at 108° C. The reaction mixture was heated at reflux for an additional 1 hour. The reaction mixture was cooled to 90° C. and then deionized (DI) water (12 mL) was added. The temperature was increased to reflux and the water was removed by azeotropic distillation. The reaction mixture was cooled again to 90° C. and more DI water (12 mL) was added. The reaction mixture was once again heated up to reflux and the water was removed. Some toluene (56.9 g) was then removed by distillation to increase the solids content. The material was cooled to room temperature and then pressure filtered through a 5.0 μm filter. Sheets were cast (made by pouring the solution in a chase and evaporating the solvent) and they were optically clear.

Example 2

DBU Formulation

DBU catalyst-1,8 Diazabicyclo[5.4.0] undec-7-ene, was added to a toluene solution of the resin-linear material obtained in Example 1 to reach 20 ppm of DBU to resin-linear solids. The formulation was coated on a release liner using a 5 mil draw down bar. The films were stripped of toluene in a forced air oven at 70° C. for 1 hour.

Example 3-7

$Al(AcAc)_3$ Formulations with and without Alumina Filler

Example 3: $Al(AcAc)_3$ (99% pure, Aldrich, lot MKBF4624U (CAS 13963-57-0)) was added to a toluene solution of the resin-linear material obtained in Example 1 to reach 200 ppm Al to resin-linear solids. The formulation was coated on a release liner using a 5 mil draw down bar. The films were stripped of toluene in a forced air oven at 70° C. for 1 hour.

Examples 4-7 were prepared by adding the amounts of alumina filler (aluminum oxide from Sigma Aldrich lot#1433701V) shown in Table 1 to $Al(AcAc)_3$ compositions prepared as described immediately above in Example 3.

TABLE 1

|  | g of Example 3 Composition | g of Alumina |
|---|---|---|
| Example 4 | 10 | 5 |
| Example 5 | 10 | 7.5 |
| Example 6 | 10 | 10 |
| Example 7 | 10 | 12.5 |

A dental mixer was used to mix the alumina filler with the resin-linear solution prepared according to Example 1. Mixed compositions were coated on a release liner using a 5 mil draw down bar. The films were stripped of toluene in a forced air oven at 70° C. for 1 hour.

Example 8

The polyorganosiloxane from Example 1 was further refluxed at 75% solids in toluene for 4 h. This material was loaded with 2500 ppm Sn(IV) catalyst from dimethyl tin dineodecanoate (DMTDN). The procedure consisted of adding this catalyst in neat form (about 23 wt. % Sn in DMTDN) to the toluene solution. A film cast from this solution was measured using oscillatory mode rheology to determine the melt rheology. The storage modulus at 150° C. was determined as was the tan delta at the same temperature. Samples were isothermally measured for 30 minutes to determine the time it takes to reach tan delta values of 1. Lower values of tan delta=1 correspond to faster curing materials.

Example 9

This example takes the material from Example 8 and planetary mixes this with NYAG4454-L from Intematix. This Ce:YAG phosphor was mixed at the following ratio: 10 g of polyorganosiloxane solid to 16 g of NYAG4454-L. Results are below:

| Example | G' at 150° C., kPa | Tan δ at 150° C. | Time to Tan δ = 1, min |
|---|---|---|---|
| 8 | 2.41 | 1.48 | 4.0 |
| 9 | 2.30 | 1.80 | 6.0 |

This result shows that DMTDN can be used to retain acceptable cure speed even at about 60 wt. % loading.

Comparative Examples 1-4

DBU Formulations with Alumina

A dental mixer was used to mix the alumina filler, in the amounts listed in Table 2, with a resin-linear solution made according to Example 2. The compositions were coated on a release liner using a 5 mil draw down bar. The films were stripped of toluene in a forced air oven at 70° C. for 1 hour.

TABLE 2

|  | g of Example 2 | g of Alumina |
|---|---|---|
| Comp. Example 1 | 10 | 5 |
| Comp. Example 2 | 10 | 7.5 |
| Comp. Example 3 | 10 | 10 |
| Comp. Example 4 | 10 | 12.5 |

ARES-RDA—with 2KSTD standard flexular pivot spring transducer, with forced convection oven) was used to measure the storage modulus (G'), loss modulus (G") and tan delta as a function of temperature. Test specimens (e.g., 8 mm wide, 1-2 mm thick) were loaded in between parallel plates and measured using small strain oscillatory rheology while ramping the temperature in a range from 25° C. to 300° C. at 5° C./min (frequency 1 Hz). Thin film samples were stacked to reach 1-2 mm in thickness for the measurement. The viscosity at 120° C. is reported as a measure for melt processability and the cure onset is calculated as the onset temperature in the G' rise. The cure onset from G' is the key measurement to support the claims in the current invention.

The results shown in Table 3 show that the compositions made according to Example 2, with DBU, and Example 3, with Al(AcAc)$_3$, have similar cure rates, with the cure onset being within 5° C. of each other. With the addition of alumina, up to a ratio of 10 g resin-linear solution to 12.5 g of alumina, the Al(AcAc)$_3$ catalyst still initiates cure within 20° C. from the original onset. See Examples 4 through 7. In contrast, alumina has a dramatic inhibition effect on the cure onset of DBU catalyzed compositions, with cure onset starting more than 100° C. higher, relative to DBU catalyzed compositions lacking alumina. See Comp. Examples 1 through 4). In most instances, cure temperatures above 200° C. are not useful in the industry.

TABLE 3

| Example | Viscosity at 120° C., Pa·s | Cure onset, ° C. |
|---|---|---|
| Example 2, DBU | 6,900 | 156 |
| Example 3, Al(AcAc)$_3$ | 5,000 | 159 |
| Example 4 (Al(AcAc)$_3$ and 5 g alumina) | 10,800 | 167 |
| Example 5 (Al(AcAc)$_3$ and 7.5 g alumina) | 22,000 | 173 |
| Example 6 (Al(AcAc)$_3$ and 10 g alumina) | 17,000 | 177 |
| Example 7 (Al(AcAc)$_3$ and 12.5 g alumina) | 31,000 | 179 |
| Comp. Example 1 (DBU and 5 g alumina) | 9,500 | 260 |
| Comp. Example 2 (DBU and 7.5 g alumina) | 16,000 | 277 |

TABLE 3-continued

| Example | Viscosity at 120° C., Pa·s | Cure onset, ° C. |
|---|---|---|
| Comp. Example 3 (DBU and 10 g alumina) | 20,000 | >300 |
| Comp. Example 4 (DBU and 12.5 g alumina) | 28,000 | >300 |

What is claimed is:

1. A curable composition comprising:
    i) an organosiloxane block copolymer comprising:
        40 to 90 mole percent disiloxy units of the formula [R$^1_2$SiO$_{2/2}$],
        10 to 60 mole percent trisiloxy units of the formula [R$^2$SiO$_{3/2}$],
        0.5 to 35 mole percent silanol groups [≡SiOH];
        wherein:
            each R$^1$, at each occurrence, is independently a C$_1$ to C$_{30}$ hydrocarbyl,
            each R$^2$, at each occurrence, is independently a C$_1$ to C$_{20}$ hydrocarbyl;
        wherein:
            the disiloxy units [R$^1_2$SiO$_{2/2}$] are arranged in linear blocks having an average of from 10 to 400 disiloxy units [R$^1_2$SiO$_{2/2}$] per linear block,
            the trisiloxy units [R$^2$SiO$_{3/2}$] are arranged in non-linear blocks having a molecular weight of at least 500 g/mole, and at least 30% of the non-linear blocks are crosslinked with each other, each linear block is linked to at least one non-linear block; and
            the organosiloxane block copolymer has a weight average molecular weight (M$_w$) of at least 20,000 g/mole; and
    ii) a metal ligand complex.

2. The curable composition of claim 1, further comprising a solvent, a filler or a phosphor.

3. The curable composition of claim 1, wherein the metal ligand complex comprises a metal acetylacetonate complex.

4. The curable composition of claim 1, wherein the metal is Al, Bi, Sn, Ti or Zr.

5. The curable composition of claim 1, wherein the metal ligand complex comprises a tetravalent tin-containing metal ligand complex.

6. The curable composition of claim 1, wherein the metal ligand complex comprises a dialkyltin dicarboxylate.

7. The curable composition of claim 1, wherein the metal ligand complex comprises dimethyltin dineodecanoate.

8. The curable composition of claim 1, wherein R$^2$ is phenyl.

9. The curable composition of claim 1, wherein R$^1$ is methyl or phenyl.

10. The curable composition of claim 1, wherein the disiloxy units have the formula [(CH$_3$)(C$_6$H$_5$)SiO$_{2/2}$].

11. The curable composition of claim 1, wherein the disiloxy units have the formula [(CH$_3$)$_2$SiO$_{2/2}$].

12. The curable composition of claim 1, further comprising a stabilizer.

13. A solid film composition comprising the curable composition of claim 1.

14. The solid film composition of claim 13, wherein the solid composition has an optical transmittance of at least 95%.

15. The cured product of the composition of claim 1.

16. An LED encapsulant comprising the compositions of claim 1.

17. A method of maintaining the cure onset temperature of a composition comprising a resin linear organosiloxane block copolymer and a filler and/or a phosphor, within about 40% of the cure onset temperature of a composition comprising the resin linear organosiloxane block copolymer, but lacking the filler and/or phosphor, the method comprising contacting the composition comprising a resin linear organosiloxane block copolymer and a filler and/or a phosphor with a metal ligand complex;
wherein:
   wherein the composition comprising a resin linear organosiloxane block copolymer is a curable composition comprising:
   an organosiloxane block copolymer comprising;
   40 to 90 mole percent disiloxy units of the formula $[R^1{}_2SiO_{2/2}]$,
   10 to 60 mole percent trisiloxy units of the formula $[R^2SiO_{3/2}]$,
   0.5 to 35 mole percent silanol groups [≡SiOH];
   wherein:
      each $R^1$, at each occurrence, is independently a $C_1$ to $C_{30}$ hydrocarbyl,
      each $R^2$, at each occurrence, is independently a $C_1$ to $C_{20}$ hydrocarbyl;
   wherein:
      the disiloxy units $[R^1{}_2SiO_{2/2}]$ are arranged in linear blocks having an average of from 10 to 400 disiloxy units $[R^1{}_2SiO_{2/2}]$ per linear block,
      the trisiloxy units $[R^2SiO_{3/2}]$ are arranged in non-linear blocks having a molecular weight of at least 500 g/mole, and at least 30% of the non-linear blocks are crosslinked with each other, each linear block is linked to at least one non-linear block; and
      the organosiloxane block copolymer has a weight average molecular weight ($M_w$) of at least 20,000 g/mole.

18. The method of claim 17, wherein the cure onset temperature is maintained within about 20% of the cure onset temperature of the composition lacking the filler and/or phosphor.

19. The method of claim 17, wherein the cure onset temperature of the composition lacking the filler is less than 220° C.

20. The method of claim 17, wherein the cure onset temperature of the composition lacking the filler is from about 120° C. to about 220° C.

21. The method of claim 17, wherein the composition comprising the filler comprises from about 2% to about 90% filler based on the total weight of the composition.

22. The method of claim 17, wherein the composition comprising the phosphor comprises from about 5% to about 80% phosphor based on the total weight of the composition.

23. A method of maintaining the time necessary to reach a tan delta value equal to 1 of a composition comprising a resin linear organosiloxane block copolymer and up to a total of 80 wt. % of a filler and/or a phosphor, within about 40% of the time necessary to reach a tan delta value equal to 1 of a composition comprising the resin linear organosiloxane block copolymer, but lacking the filler and/or phosphor, the method comprising contacting the composition comprising a resin linear organosiloxane block copolymer and a filler and/or a phosphor with a metal ligand complex;
wherein:
   wherein the composition comprising a resin linear organosiloxane block copolymer is a curable composition comprising:
   an organosiloxane block copolymer comprising:
   40 to 90 mole percent disiloxy units of the formula $[R^1{}_2SiO_{2/2}]$,
   10 to 60 mole percent trisiloxy units of the formula $[R^2SiO_{3/2}]$,
   0.5 to 35 mole percent silanol groups [≡SiOH];
   wherein:
      each $R^1$, at each occurrence, is independently a $C_1$ to $C_{30}$ hydrocarbyl,
      each $R^2$, at each occurrence, is independently a $C_1$ to $C_{20}$ hydrocarbyl;
   wherein:
      the disiloxy units $[R^1{}_2SiO_{2/2}]$ are arranged in linear blocks having an average of from 10 to 400 disiloxy units $[R^1{}_2SiO_{2/2}]$ per linear block,
      the trisiloxy units $[R^2SiO_{3/2}]$ are arranged in non-linear blocks having a molecular weight of at least 500 g/mole and at least 30% of the non-linear blocks are crosslinked with each other, each linear block is linked to at least one non-linear block; and
   the organosiloxane block copolymer has a weight average molecular weight ($M_w$) of at least 20,000 g/mole.

\* \* \* \* \*